United States Patent
Belfiori

(10) Patent No.: US 11,281,301 B2
(45) Date of Patent: Mar. 22, 2022

(54) WEARABLE CONTROLLER FOR WRIST

(71) Applicant: FlickTek Ltd, London (GB)

(72) Inventor: Alfredo Belfiori, London (GB)

(73) Assignee: FlickTek Ltd, London (GB)

( * ) Notice: Subject to any disclaimer, the term of this patent is extended or adjusted under 35 U.S.C. 154(b) by 432 days.

(21) Appl. No.: 16/074,779

(22) PCT Filed: Feb. 3, 2017

(86) PCT No.: PCT/EP2017/052473
§ 371 (c)(1),
(2) Date: Aug. 2, 2018

(87) PCT Pub. No.: WO2017/134283
PCT Pub. Date: Aug. 10, 2017

(65) Prior Publication Data
US 2019/0011994 A1 Jan. 10, 2019

Related U.S. Application Data

(63) Continuation of application No. 15/014,021, filed on Feb. 3, 2016, now abandoned.

(51) Int. Cl.
*G06F 3/01* (2006.01)
*G06K 9/00* (2006.01)
(Continued)

(52) U.S. Cl.
CPC .............. *G06F 3/017* (2013.01); *G01L 1/16* (2013.01); *G06F 1/163* (2013.01); *G06F 1/3287* (2013.01);
(Continued)

(58) Field of Classification Search
CPC ..... A61B 5/1124; A61B 5/1125; G06F 1/163; G06F 1/3287; G06F 3/017; G06F 3/014;
(Continued)

(56) References Cited

U.S. PATENT DOCUMENTS 5,649,535 A * 7/1997 Voith ................. A61B 5/02208
600/493
8,981,765 B2 * 3/2015 Sano .................... A61B 5/1125
324/207.11
(Continued)

FOREIGN PATENT DOCUMENTS

CN  102579013 A * 7/2012
EP  1157585      9/2005
(Continued)

OTHER PUBLICATIONS

CN-102579013-A, Jul. 2012, Liguo Zhang, English Translation by PE2E Search. (Year: 2012).*
(Continued)

*Primary Examiner* — Matthew Kremer
*Assistant Examiner* — Avery M Foley

(57) ABSTRACT

The present invention relates to wearable devices. A wrist-worn sensor for measuring wrist tendon forces corresponding to specific finger motions is provided, the sensor comprising: one or more piezoelectric sensors, wherein the one or more piezoelectric sensors emit electric currents generated upon pressure from wrist tendons on the one or more piezoelectric sensors; and a processing module configured for converting the electric currents generated upon pressure from wrist tendons into signals and for processing the signals for identification of one or more specific finger motions. A method for detecting specific finger movements based on wrist-tendon forces is also provided.

16 Claims, 35 Drawing Sheets

(51) Int. Cl.
    *G06F 1/3287* (2019.01)
    *G06K 9/62* (2006.01)
    *G06F 1/16* (2006.01)
    *G06K 9/22* (2006.01)
    *G01L 1/16* (2006.01)
    *H05K 1/18* (2006.01)
    *G06F 3/038* (2013.01)

(52) U.S. Cl.
    CPC .............. *G06F 3/014* (2013.01); *G06F 3/038* (2013.01); *G06K 9/0053* (2013.01); *G06K 9/00355* (2013.01); *G06K 9/00503* (2013.01); *G06K 9/00523* (2013.01); *G06K 9/00536* (2013.01); *G06K 9/22* (2013.01); *G06K 9/627* (2013.01); *G06K 9/6269* (2013.01); *H05K 1/189* (2013.01); *H05K 2201/10151* (2013.01)

(58) Field of Classification Search
    CPC . G06F 1/16; G06F 1/162; G06F 3/016; G06F 3/038; G01L 1/16; G01L 1/162; G06K 9/00355; G06K 9/00503; G06K 9/00523; G06K 9/0053; G06K 9/00536; G06K 9/22; G06K 9/6269; G06K 9/627; H05K 1/189; H05K 2201/10151
    See application file for complete search history.

(56) References Cited

U.S. PATENT DOCUMENTS

| | | | | |
|---|---|---|---|---|
| 9,024,874 | B2* | 5/2015 | Stetten | G06F 3/0321 345/158 |
| 9,183,760 | B2* | 11/2015 | Shin | G06F 3/0346 |
| 10,194,808 | B1* | 2/2019 | Thompson | A61B 5/02158 |
| 2003/0013992 | A1* | 1/2003 | Uchigaki | G01N 33/48757 600/584 |
| 2011/0053173 | A1* | 3/2011 | Hood | G07F 17/32 435/7.1 |
| 2013/0188322 | A1 | 7/2013 | Lowe | |
| 2014/0028546 | A1 | 1/2014 | Jeon et al. | |
| 2014/0155784 | A1* | 6/2014 | Smith | G06K 9/6229 600/595 |
| 2015/0182160 | A1* | 7/2015 | Kim | A61B 5/742 600/301 |
| 2015/0265214 | A1* | 9/2015 | De Kok | A61B 5/681 600/301 |
| 2016/0007925 | A1* | 1/2016 | Mirov | A61B 5/6802 356/400 |
| 2016/0070341 | A1* | 3/2016 | Zhang | G06F 3/017 345/156 |
| 2016/0246368 | A1* | 8/2016 | Camacho Perez | G06F 1/163 |
| 2016/0313801 | A1* | 10/2016 | Wagner | G09B 21/02 |
| 2017/0003762 | A1* | 1/2017 | Ishii | G06F 3/0383 |
| 2017/0262066 | A1* | 9/2017 | Kawamura | G06F 1/163 |

FOREIGN PATENT DOCUMENTS

| | | |
|---|---|---|
| WO | WO 2015/033327 | 3/2015 |
| WO | WO 2017/134283 | 8/2017 |

OTHER PUBLICATIONS

Extended European Search Report dated Feb. 20, 2017 from the European Patent Office Re. Application No. 16275066.5. (10 pages).
International Search Report and the Written Opinion dated Apr. 24, 2017 From the International Searching Authority Re. Application No. PCT/EP2017/052473. (16 Pages).

* cited by examiner

WEARABLE CONTROLLER FOR WRIST

RELATED APPLICATIONS

This application is a National Phase of PCT Patent Application No. PCT/EP2017/052473 having International filing date of Feb. 3, 2017, which claims the benefit of priority of European Patent Application No. 16275066.5 filed on Apr. 26, 2016, and is Continuation-in-Part of U.S. patent application Ser. No. 15/014,021, filed on Feb. 3, 2016. The contents of the above applications are all incorporated by reference as if fully set forth herein in their entirety.

FIELD AND BACKGROUND OF THE INVENTION

This disclosure relates to the field of the wearable devices, biometric controller and interfaces and biomedical engineering. More specifically this disclosure is directed to a human-computer interface and a system for providing the same. According to an aspect of the disclosure, a controller, placed around the wrist, able to read fingers movements is described. The disclosure is also directed to a process for sending commands to one or more computing devices by means of a wearable device.

The technology that has been used as an interface between human and machine had so far faced two big revolutions. Initially large electronic companies produced interfaces based on the use of buttons, such as control panels, keyboards and mouse. This technology was later replaced by touchscreen, an innovative solution that does not require physical buttons but is responsive to the contact of a body part such as fingertip. Next step in the human-machine interface evolution will be the elimination of physical contact between the user and the device controlled. This will be achieved using the biometric body signals, such as the electric, mechanical or vibrational phenomena related to muscular contractions, to control any electronic device.

SUMMARY OF THE INVENTION

This disclosure is directed to a human-computer interface (HCI) able to detect and interpret finger gestures and send the information to any electronic device, particularly a computing device. More specifically the disclosure relates to a controller consisting of an array of cantilever piezoelectric sensors for detecting movements of tendons in the wrist corresponding to specific finger gestures.

Aspects and embodiments of the present invention are set out in the appended claims. These and other aspects and embodiments of the invention are also described herein.

In an embodiment, the disclosure teaches a wrist-worn sensor for measuring wrist tendon forces corresponding to specific finger motions including an array of cantilever piezoelectric sensors where the piezoelectric sensors emit electric currents generated upon pressure from the wrist tendons on the tip of the piezoelectric sensors, a processing module configured for converting the electric currents into signals and processing the signals for identification of one or more specific finger motions, and a flexible PCB connecting the piezoelectric sensors to the processing module.

In another aspect, there is provided a wrist-worn sensor for measuring wrist tendon forces corresponding to specific finger motions one or more piezoelectric sensors, wherein the one or more piezoelectric sensors emit electric currents generated upon pressure from wrist tendons on the one or more piezoelectric sensors; and a processing module configured for converting the electric currents generated upon pressure from wrist tendons into signals and for processing the signals for identification of one or more specific finger motions.

Preferably, the one or more piezoelectric sensors are cantilever piezoelectric sensors, and the one or more piezoelectric sensors preferably emit electric currents generated upon pressure from wrist tendons on the tip of the one or more piezoelectric sensors. A plurality of piezoelectric sensors arranged in an array may be provided. The array may be a linear array. The piezoelectric sensors are preferably spaced apart at their tips by less than 8 mm, more preferably by less than 5 mm, and still more preferably by less than 2 mm. The piezoelectric sensors are preferably arranged to overlap partially such that their sensor areas overlap. In an aspect of the disclosure, the array of piezoelectric sensors is configured to have a spatial resolution of less than 2 mm. In yet another aspect, the cantilever sensors are configured in a linear array. In still another aspect, the linear array comprises four piezo-electric sensors with partially overlapping sensor areas. In yet another aspect, the array of cantilever piezoelectric sensors is positioned proximally to a wearer's Flexor Carpi Ulnaris Tendon, Flexor Digitorum Profundus Tendon and Flexor Digitorum Superficialis Tendon. In another aspect of the disclosure, the array of cantilever piezoelectric sensors is configured to optimally capture the tension applied to each tendon in the wrist. In an embodiment of the disclosure, the sensors are positioned at an angle greater than 10 degrees relative to the flexible PCB.

In another aspect, the piezoelectric sensors are embedded in an elastomeric material. In a preferred aspect, the elastomeric material is selected from the list consisting of silicone rubber, polymer foam and polymer elastomer. In an aspect of the disclosure, the elastomeric material filters out low amplitude high frequency signals.

Preferably, the wrist-worn sensor may further comprise a support member for supporting the one or more piezoelectric sensors. The one or more piezoelectric sensors may be embedded in the support member. The support member may be formed from an elastomeric material. The support member preferably comprises one or more mounting slots for the one or more piezoelectric sensors. The one or more slots may be arranged to support the one or more piezoelectric sensors at an angle relative to a surface of the support member such that, in use, the tip of the or each piezoelectric sensor is adjacent a wearer's wrist, preferably where the angle is between 5 degrees and 45 degrees, more preferably between 5 degrees and 20 degrees, yet more preferably between 8 degrees and 12 degrees, and most preferably 10 degrees. Preferably, the slots terminate in a series of slits on a surface of the support member, the slits being proximate a wearer's wrist in use such that the tips of the sensors are positioned within said slits. The one or more slots may extend through the support member. The support member may comprise one or more cutouts, which may extend into the one or more slots, preferably at a location proximate an end of the slots. The one or more cutouts may be provided on an opposite side of the support member to a wearer's wrist in use, or alternatively may be provided on a side of the support member proximate to a wearer's wrist in use. Each slot may comprise a recess for supporting a piezoelectric sensor. The support member is preferably formed from an upper portion and a lower portion, wherein the one or more slots are formed when the upper portion is engaged with the lower portion. The upper and lower portions preferably comprise a plurality of angled steps arranged to form the slots when the upper and lower portions are in register with each other. The upper portion may be pivotably connected to the lower portion.

The one or more piezoelectric sensors may be arranged such that, in use, the one or more piezoelectric sensors are proximate to one or more of a user's Flexor Carpi Ulnaris Tendon, Flexor Digitorum Profundus Tendon and Flexor Digitorum Superficialis Tendon. The one or more piezoelectric sensors may further be arranged such that, in use, the piezoelectric sensors substantially capture tension applied to any or all of a user's wrist tendons. Preferably, the sensor further comprises a flexible PCB connecting the array of cantilever piezoelectric sensors to the processing module.

In another aspect, there is provided an apparatus comprising the wrist-worn sensor as described herein and a controller module. The apparatus may communicate wirelessly with one or more computing devices. The apparatus may further comprise a button for switching the device from a sleeping, power-saving mode to an active acquisition mode, wherein the button may be arranged such that, in use, the button is in contact with a user's wrist so as to be triggered by the user flexing the wrist. The controller module may be configured to cause one or more computing devices to automatically execute one or more specific commands upon identification of one or more of the specific finger motions.

In another aspect, there is provided a bracelet comprising the wrist-worn sensor as described herein or the apparatus as described herein. In another aspect, there is provided a watch comprising the wrist-worn sensor as described herein or the apparatus as described herein.

In an embodiment of the human computer interface, a controller module is configured to cause one or more computing devices to automatically execute one or more specific commands upon identification of one or more of the specific finger motions. In another embodiment, the computer interface communicates wirelessly with one or more computing devices. In yet another embodiment, the human computer interface includes a button placed in contact with a user's wrist so as to be triggered by the user flexing the wrist and causing the activation of the device from a sleeping, power-saving mode to an active acquisition mode.

In another embodiment, the wrist-worn sensor includes a controller module configured to cause one or more computing devices to automatically execute one or more specific commands upon identification of one or more of the specific finger motions.

More specifically, a wearable wrist controller is described which includes an array of cantilever piezoelectric sensors in order to monitor the movements of muscles, tendons and other body tissues, the combination of their movements in the wrist and their initial and final positions.

The present disclosure provides a wired or wireless HCI for interacting with computing systems and attached devices via electrical signals generated by specific movement of the user's fingers. The specific movements follow a fixed protocol. Following an initial automated calibration process, measurement and interpretation of signals generated by finger movements is accomplished by sampling signals with the cantilever piezoelectric sensors of the wrist worn wearable controller. In operation, the wrist worn wearable controller is donned by the user and placed into a fixed position on the surface of the user's wrist skin. Automated cues or instructions are then provided to the user for fine-tuning control of the wearable controller for the wrist. Examples of wearable controllers for the wrist include articles of manufacture, such as a wristband, wristwatch, or articles of clothing having a plurality of integrated piezo-electric sensor nodes, and associated electronics.

According to an aspect of the disclosure, a calibration phase is provided for the human-computer interface. The calibration phase automatically identifies the parameters needed to run a software program installed in the module, or in one or more external computing devices. The software receives the signals and identifies the parameter for the training following a protocol of specific finger gestures. The calibration phase of the human-computer interface which is described herein involves the user performing one or more specific finger gestures as part of a training phase for the calibration phase. This allows to precisely tune the performance of the interface to the specific biometry of the user. More specifically, the sensors provided in the device measure the signals that are associated with one or more of the specific user gestures. More specifically, the human-computer interface further comprises a module for automatically determining the position of the signal source on the surface of the skin of the user's wrist, in order to identify which finger moved and how.

According to another aspect of the disclosure, the human-computer interface of the disclosure is used in a process for detecting specific finger movements based on wrist tendon forces, the process comprising the steps of:
a) sensing one or more electric signals produced by an array of cantilever piezoelectric sensors from the pressure of wrist tendons applied to the tip of the sensors;
b) extracting a set of characteristic features from the electric signal;
c) feeding the characteristic features to a trained classifier;
d) identifying one or more specific finger gestures associated with specific classes of the trained classifier; and
e) automatically directing one or more computing devices to execute one or more commands corresponding to one or more of the identified finger gestures.

According to another aspect, there is provided a method for detecting specific finger movements based on wrist-tendon forces, the method comprising the steps of: sensing one or more electric signals produced by one or more piezoelectric sensors upon pressure of wrist tendons on the sensors; extracting a set of characteristic features from the one or more electric signals produced by the one or more piezoelectric sensors; feeding the characteristic features to a trained classifier; and identifying one or more specific finger gestures associated with specific classes of the trained classifier.

Preferably, the one or more piezoelectric sensors are one or more cantilever piezoelectric sensors. Preferably, the one or more piezoelectric sensors produce electric signals upon pressure from wrist tendons on the tip of the one or more piezoelectric sensors. Preferably, a plurality of piezoelectric sensors are provided in the form of an array.

In an aspect of the disclosure, the process and/or method further includes the step of performing an initial calibration of the sensors which evaluates gesture generated signals associated with a subset of user finger gestures to determine expected signals during the finger-gesture identification step. Preferably, the evaluation of the gesture generated signals is based on at least one of: the repeatability of a specific gesture, the similarity between different gestures, the magnitude of a specific gesture, the length of a specific gesture, and the pace of a specific gesture.

In another aspect of the disclosure, the process and/or method further includes the step of calibrating the controller by automatically identifying the parameters needed to run a software program installed in the module or in one or more external computing devices, the software program receiving the signals and identifying the parameter for the training following a protocol of specific finger gestures.

In yet another aspect of the disclosure, the feature extraction step further includes the steps of considering all electric signals coming from the sensors during each finger movement and gesture, band-pass filtering said signals to limit the data to a predetermined amount, and analyzing the signals by means of a feature extractor. In still another aspect of the disclosure, the feature extraction step further analyzes the signals in order to obtain a set of features describing the signals to be compared with other signal features coming from other finger movements and gestures. In another aspect, the features are selected from the list consisting of time domain features and frequency domain features. In another aspect of the disclosure, the process and/or method further includes the step of a step of disabling one or more of the sensors during rest.

Preferably, the process and/or method further comprises a step of detecting changes in the position and/or tightness of the array of piezoelectric sensors in relation to the wrist tendons. Preferably, the process and/or method further comprises a step of providing feedback to a user relating to the detectability of the one or more specific finger gestures that they perform.

Preferably, the process and/or method further comprises a step of automatically directing one or more computing devices to execute one or more commands corresponding to one or more of the identified finger gestures.

Preferably, the process involves positioning the wearable device in contact with the surface of a user's wrist skin. Through the one or more piezoelectric cantilever sensors, the state and the activity of the different body tissues at the user's wrist are then measured. The process also involves automatically evaluating gesture-generated signals of the user, which are measured via the one or more of cantilever piezoelectric sensors, in order to automatically identify one or more specific gestures of the user from a predefined set of gestures.

Preferably, the process further comprises performing an initial calibration phase which evaluates gesture generated signals associated with a subset of user finger gestures to determine expected signals during the automatic evaluation phase. According to a preferred feature, commands associated with one or more of the gestures of the set of gestures can be user definable.

In another aspect, there is provided a method for detecting specific finger movements based on wrist-tendon forces as described herein using a wrist-worn sensor as described herein. In another aspect, there is provided a method for detecting specific finger movements based on wrist-tendon forces as described herein using an apparatus as described herein. The method may further comprise a step of calibrating the controller by automatically identifying the parameters needed to run a software program installed in the module or in one or more external computing devices, the software program receiving the signals and identifying the parameter for the training following a protocol of specific finger gestures.

In another aspect, there is provided a system comprising a wrist-worn sensor as described herein and a controller module. In another aspect, there is provided a system comprising the apparatus as described herein and one or more computing devices; wherein the controller module is configured to cause one or more computing devices to automatically execute one or more specific commands upon identification of one or more of the specific finger motions.

In another aspect, there is provided a support member for one or more piezoelectric sensors as described herein.

According to another aspect of the disclosure, a system for providing a human-computer interface (HCI) comprises a user-wearable device having one or more cantilever piezoelectric sensors. The user-wearable device is configured to be placed against the surface of the user's wrist. The system also comprises an automated calibration process which maps finger gestures generated signals corresponding to one or more specific user finger gestures to one or more specific commands. The finger gestures generated signals are measured by a linear or non-linear array of cantilever piezoelectric sensors. Furthermore, the system comprises an automated process for disabling some of said sensors during rest, and an automated process for evaluating one or more user gestures associated with the signals captured by the sensor array and to identify one or more commands associated with those user gestures. The system also comprises a process for transmitting specific commands associated with one or more specific user gestures to one or more computing devices.

Preferably, the user-wearable device of the above-mentioned system includes a wireless or wired interface to the one or more computing devices.

The invention extends to a wrist-worn sensor, a method, a computer program product, a system and an apparatus substantially as herein described and/or as illustrated with reference to the accompanying figures. The invention also provides a computer program or a computer program product for carrying out any of the methods described herein, and/or for embodying any of the apparatus features described herein, and a computer readable medium having stored thereon a program for carrying out any of the methods described herein and/or for embodying any of the apparatus features described herein.

The invention also provides a signal embodying a computer program or a computer program product for carrying out any of the methods described herein, and/or for embodying any of the apparatus features described herein, a method of transmitting such a signal, and a computer product having an operating system which supports a computer program for carrying out the methods described herein and/or for embodying any of the apparatus features described herein.

Any, some and/or all features in one aspect may be applied to any, some and/or all features in any other aspect, in any appropriate combination. In particular, method aspects may be applied apparatus aspects, and vice versa. As used herein, means plus function features may be expressed alternatively in terms of their corresponding structure, such as a suitably programmed processor and associated memory. Furthermore, features implemented in hardware may generally be implemented in software, and vice versa. Any reference to software and hardware features herein should be construed accordingly.

It should also be appreciated that particular combinations of the various features described and defined in any aspects of the invention can be implemented and/or supplied and/or used independently.

As used herein, the term 'wrist tendon forces' preferably refers to or connotes any force or pressure exerted by one or more tendons (in a user's wrist) against an object placed adjacent the skin proximate one or more of the tendons, which 'forces' may include tension, compression, and any forces resulting from movement of one or more of the tendons (lateral or otherwise). As used herein, the term 'finger motion' preferably refers to or connotes a motion or gesture made by the user using (or involving) their fingers, hand, or wrist. As used herein, the term 'pace' preferably refers to or connotes how quickly the user performs a plurality of gestures, including how much time the user leaves in between an initial gesture and a subsequent gesture.

By controlling a device using the controller described herein, physical contact such as controlling a smartphone through a touchscreen, for example, may no longer be required (or at least reduced). The finger movement, made without visual control, can trigger the controller to send a control signal or some data to other electronic devices.

In view of the above summarized capabilities, and in further view of the following detailed description, it should be understood that the controller may provide users with a "universal" input mechanism that can be used to control any computing device, applications running of computing devices, electronic or mechanical devices coupled to a computing device, or any other electronic device (television, radio, appliance, light switch, etc.) having an appropriate infrastructure or interface for receiving input from a wired or wireless controller.

Note also that the use of a small wearable device such as the controller, which may be under the user's clothes, if desired, may provide a mechanism that is unobtrusive (i.e., the user can be using her hands to perform other tasks while using controller to provide active control of one or more devices). Further, it should also be appreciated that the control and interface capabilities provided by the controller are potentially invisible in the sense that a user wearing one or more such controllers can remotely interact with various devices without anyone else being able to see or hear any overt actions by the user to indicate that the user is interacting with such devices.

Some of the advantages offered by the controller are that the controller enables finger movements generated signal to control computing devices, applications, and attached devices with little preparation and setup on the part of the user. In fact, in the simplest embodiment, the user may simply place the controller on the wrist, which placement requires no expertise or attention to specific sensor node placement. Further, the controller may allow users to move freely as they would if they were not wearing the device.

BRIEF DESCRIPTION OF THE SEVERAL VIEWS OF THE DRAWINGS

The disclosure will be now described in more detail purely by way of example, with reference to the attached drawings, given as non-limiting examples, wherein.

DESCRIPTION OF SPECIFIC EMBODIMENTS OF THE INVENTION

A wearable controller as described herein is configured for measuring user muscles, tendons and bones position and activity on the wrist to interact with and control one or more computing devices. More specifically, the controller provides a wearable device having a linear array of cantilever piezoelectric sensors for detecting the movement of tendons in the wrist, an acquisition module, a signal processing module and a module for interacting with and/or controlling an external device. The external device may be a general purpose computing devices, software applications running on such computing devices, personal music players, physical devices coupled to a computing device, bionic devices, game consoles, televisions or other multimedia devices, virtual devices such as a virtual piano or virtual guitar implemented within a computing environment.

The controller is implemented in various form factors. In various embodiments, the controller may be implemented as a wristband, a wristwatch, or any other physical device or collection of devices worn by the user that has sufficient contact with the surface of the user's wrist skin to measure the activity of one or more of the user's tendons, muscles and other body tissues, and their combinations. Further, it should also be understood that a user can wear multiple controllers, with each such controller being used to interact with the same or a different computing device, application, or other attached device.

The voluntary movements made with the finger are generated by the muscle contraction in the forearm. These muscles transmit the force through the tendons.

Therefore the tendons are subject to the tension forces and to the movements dictated by the skeleton mechanics. Every finger movement has a particular force and movement pattern. Every finger has its own particular set of tendons that move it, different from every other finger. The path of the tendon along the wrist is not rectilinear and is not strictly parallel to the forearm axis. The force vector that describes the dynamic of the force generated by the muscle contraction that moves the finger, is made of two components: one parallel to the forearm axis and one perpendicular. The tendon that pulls the finger moves the body tissues all around itself (body tissues comprising blood vessel, fat and skin).

The component of the force perpendicular to the forearm axis can be studied indirectly outside the wrist attaching a set of sensor to the skin at the wrist level and measuring the force needed to balance the perpendicular force vector. The controller described herein measures in different ways all the movements in the wrist caused by finger gestures using an array of cantilever piezoelectric sensors. The measurements acquired from the sensors are combined and analyzed and classified by the controller and the control command sent to any electronic device.

Figure 1:
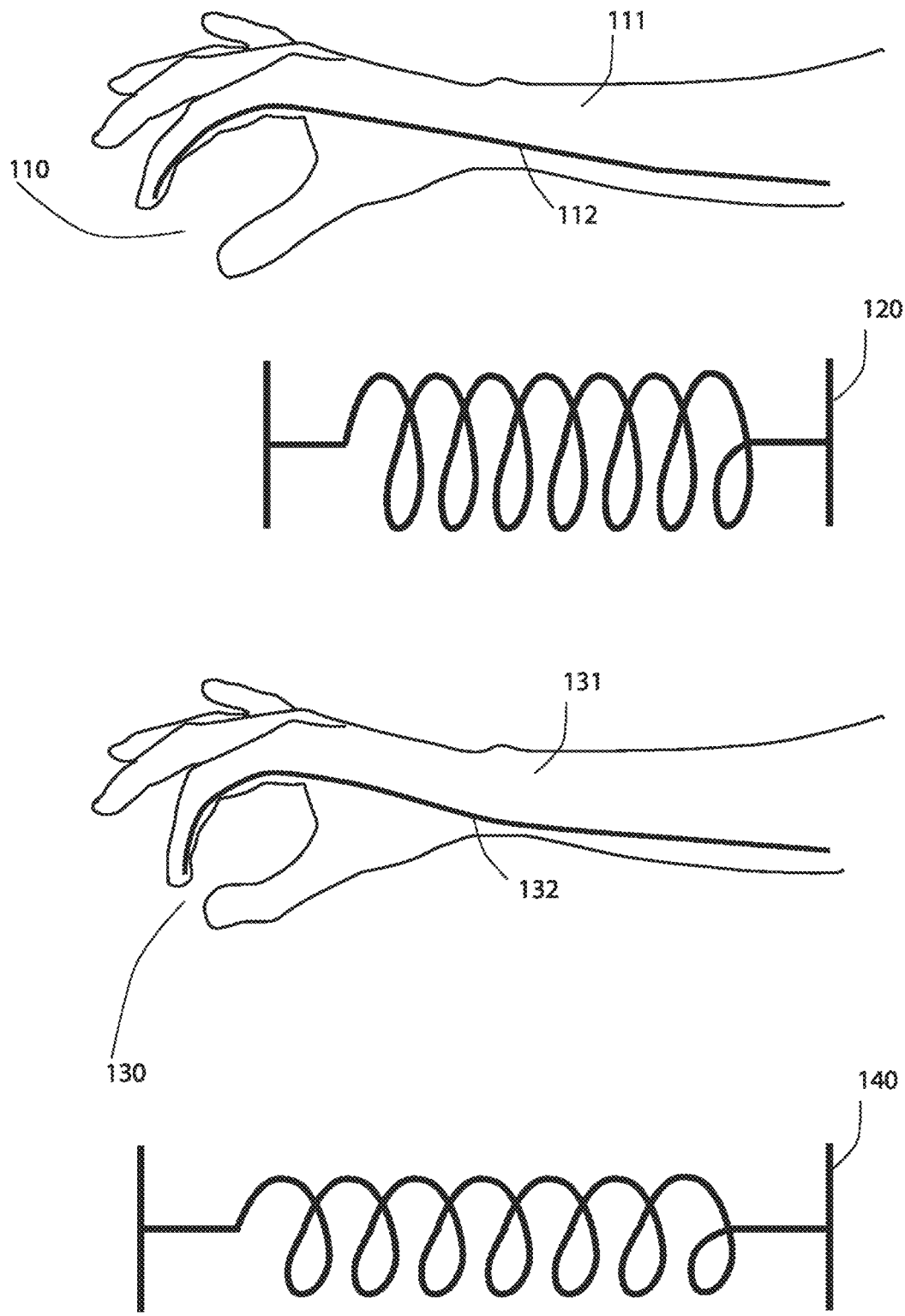
FIG. 1 illustrates the effect of the finer movement on the associated tendon.

FIG. 1 illustrates the effect of finger movements on the associated tendon. The tendon operates as an elastic element such as a spring. With fingers in a resting position 110, the tendon 112 in the arm 111 can be represented as a spring 120 without tension where no forces are applied to on both attachments of the spring. With fingers in a closing position 130, the tendon 132 is stretched just as the spring 140 is stretched as tension is applied. It is an object of the cantilever sensors in contact with the skin on the wrist to measure the tension applied to the tendon.

The cantilever piezoelectric sensors detect the movements of tendons associated with various finger gestures. A microcontroller or a microprocessor and the related electronics receive the signals from the sensors in order to process them and to send information, such as commands, to other devices.

Figure 2:
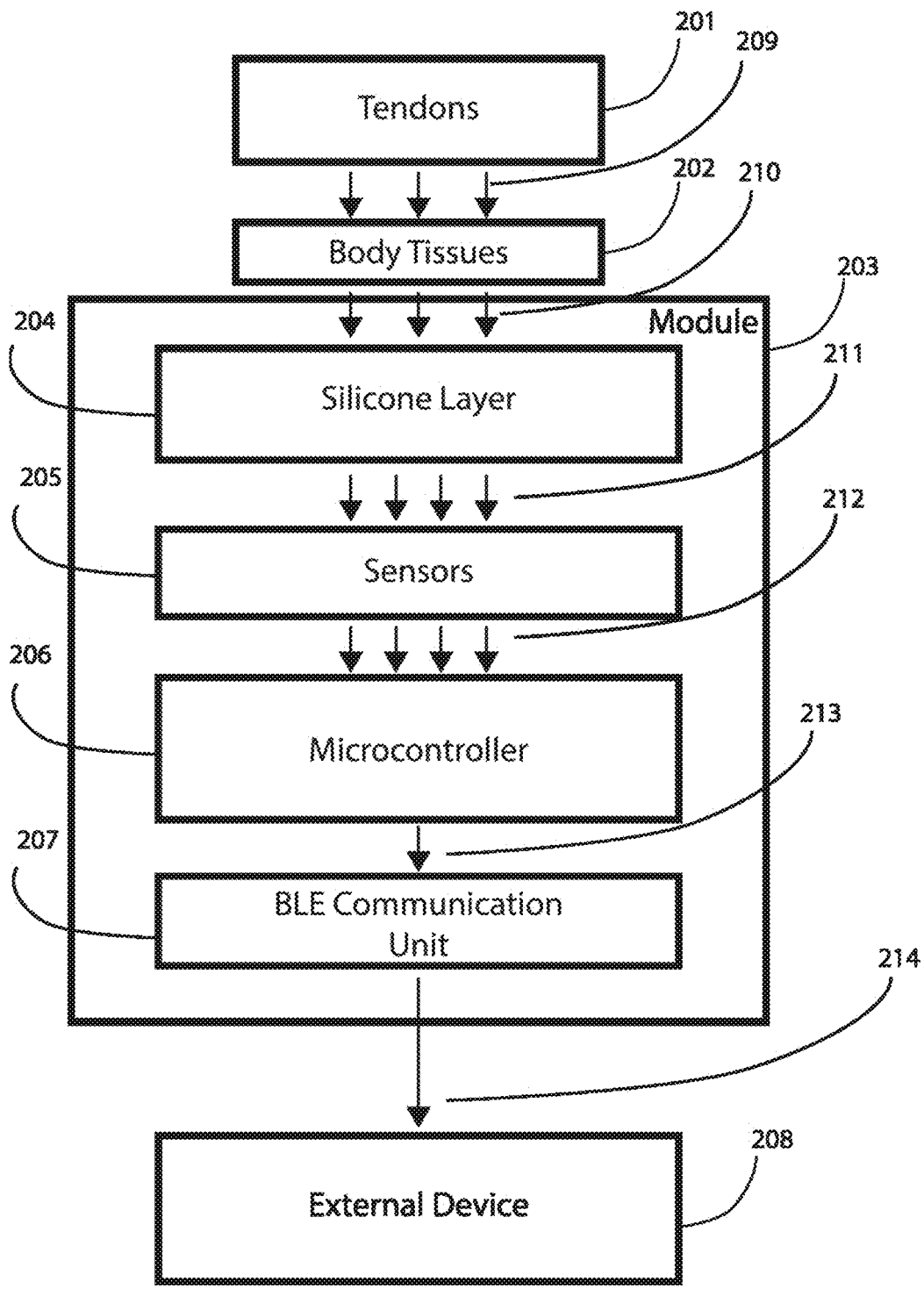
FIG. 2 is an illustration of the sensor module.

FIG. 2 is an illustration of the different components of the sensor module. Movements of tendons 201 apply pressure on body tissues in the wrist 202. The sensor module 204 comprises a silicone layer 204 in which a plurality of cantilever sensors 205 are embedded. The sensors 205 acquire the pressure information 210 from the tendon movements and transmit the information to the microcontroller 206. The microcontroller 206 in turns transmits commands to a communication unit 207 which controls an external device 208. The above-described functional modules and components are employed for implementing various embodiments of the controller. As summarized above, the controller provides a unique device for measuring user hand activity associated with particular user gestures or motions for interacting with and controlling one or more computing devices.

Figure 3:
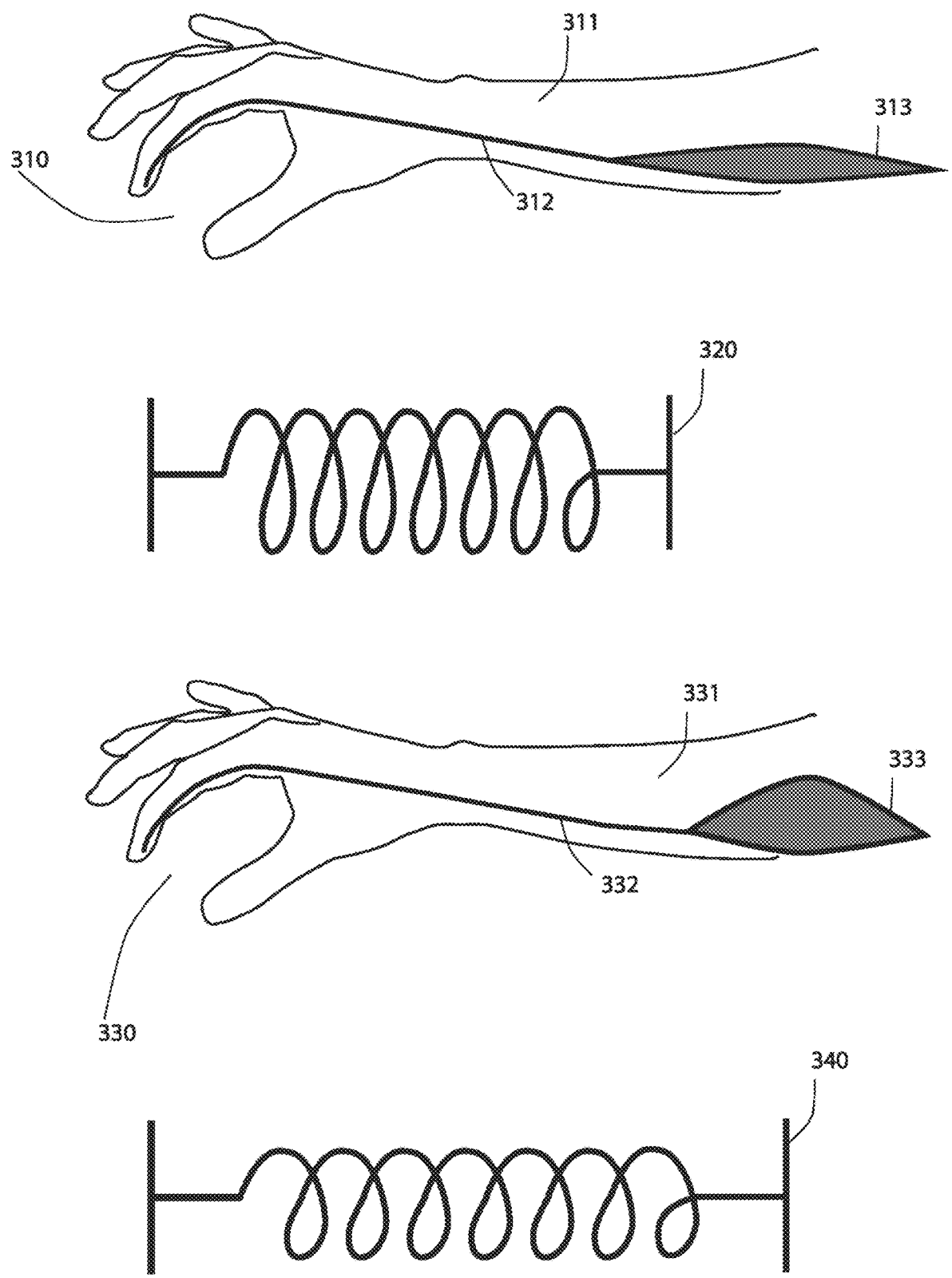
FIG. 3 illustrates the effect of muscle contraction on the associated tendon.

FIG. 3 illustrates the effect of muscle contraction on the associated tendon. The tendon can be represented as an elastic element, such as a spring. In the first view, with fingers 310 at rest, the muscle 313 in the arm 311 is relaxed and applies no tension to the tendon 312. The tendon 312 in the arm 311 is in the resting status due to the finger position 310. In this case, the tendon can be represented as a spring 320 where no forces are applied to on both attachments of the spring, therefore without tension. In the second view the tendon 332 is stretched by the contraction of the muscle 333, whereas the finger position remains the same. This is similar to the situation where the spring 340 is stretched and the tension applied is higher. It is therefore an object the cantilever sensors, indirectly in contact with the tendons through the skin to measure the increase in tension of the tendons.

Figure 4:
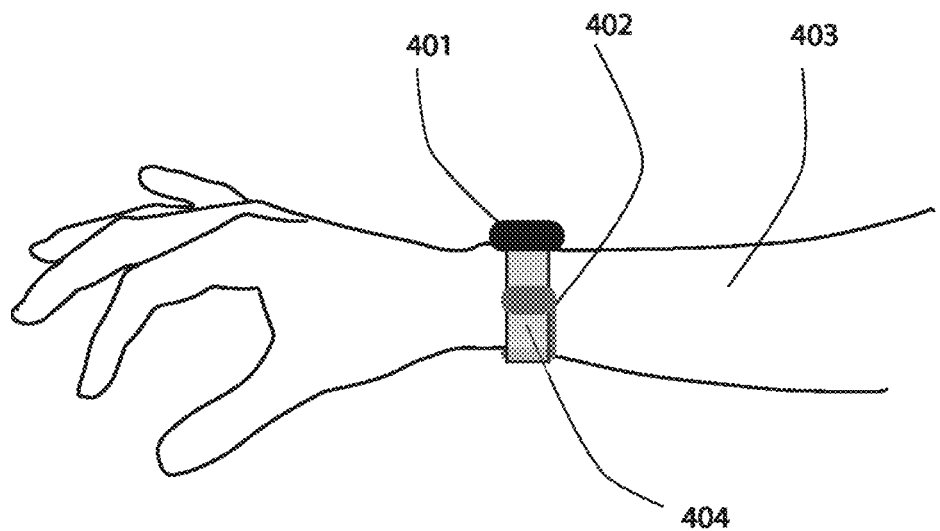
FIG. 4 is an illustration of wrist worn sensor.

FIG. 4 is an illustration of an embodiment of a wrist worn sensor. In this embodiment, the controller 402 is attached to the wristband 404 of a wristwatch 401.

Figure 5:
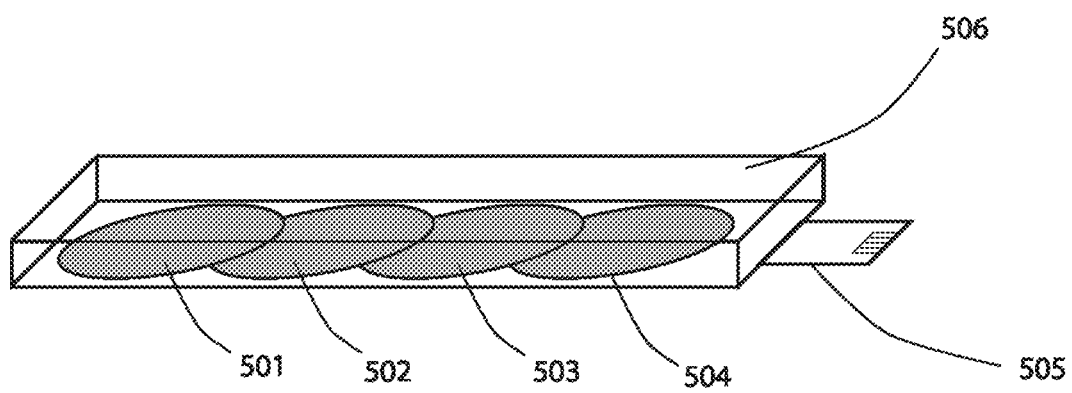
FIG. 5 is an illustration of the cantilever piezoelectric sensor.

FIG. 5 is an illustration of an embodiment of the cantilever piezoelectric sensor module. In this embodiment, four partially overlapping cantilever piezoelectric elements 501, 502, 503 and 504 are embedded in a silicone module and electrically connected to a thin film PCB 505.

Figure 6:
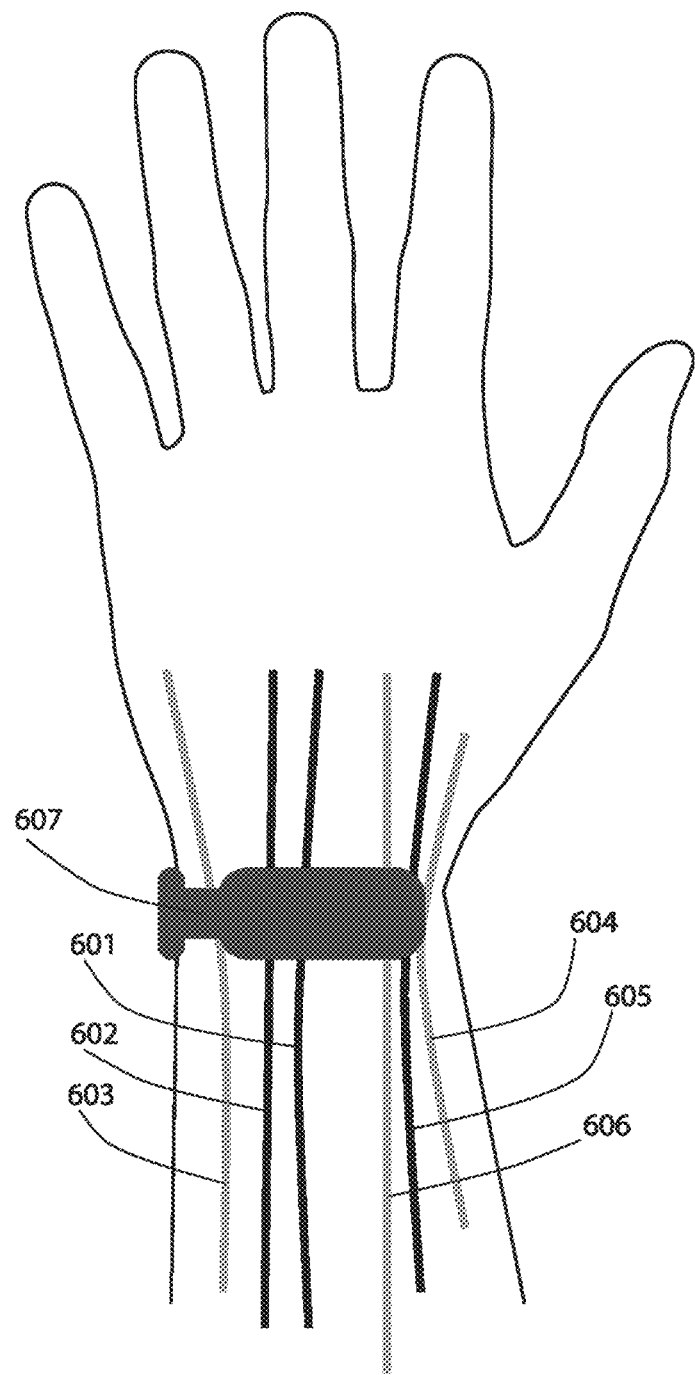
FIG. 6 is an illustration of the tendons in relation to finger movements.

FIG. 6 is an illustration of the tendons whose tension the controller is configured to measure. The six tendons are Flexor Digitorum Superficialis Tendon 601, Flexor Digitorum Profundus Tendon 602, Flexor Carpi Ulnaris Tendon 603, Flexor Carpi Radialis Tendon 604 Flexor Pollicis Longus Tendon in Radial Bursa 605 and Palmaris Longus Tendon 606. The most informative tendons relatively to the finger gestures are 601, 602 and 603.

Figure 7:
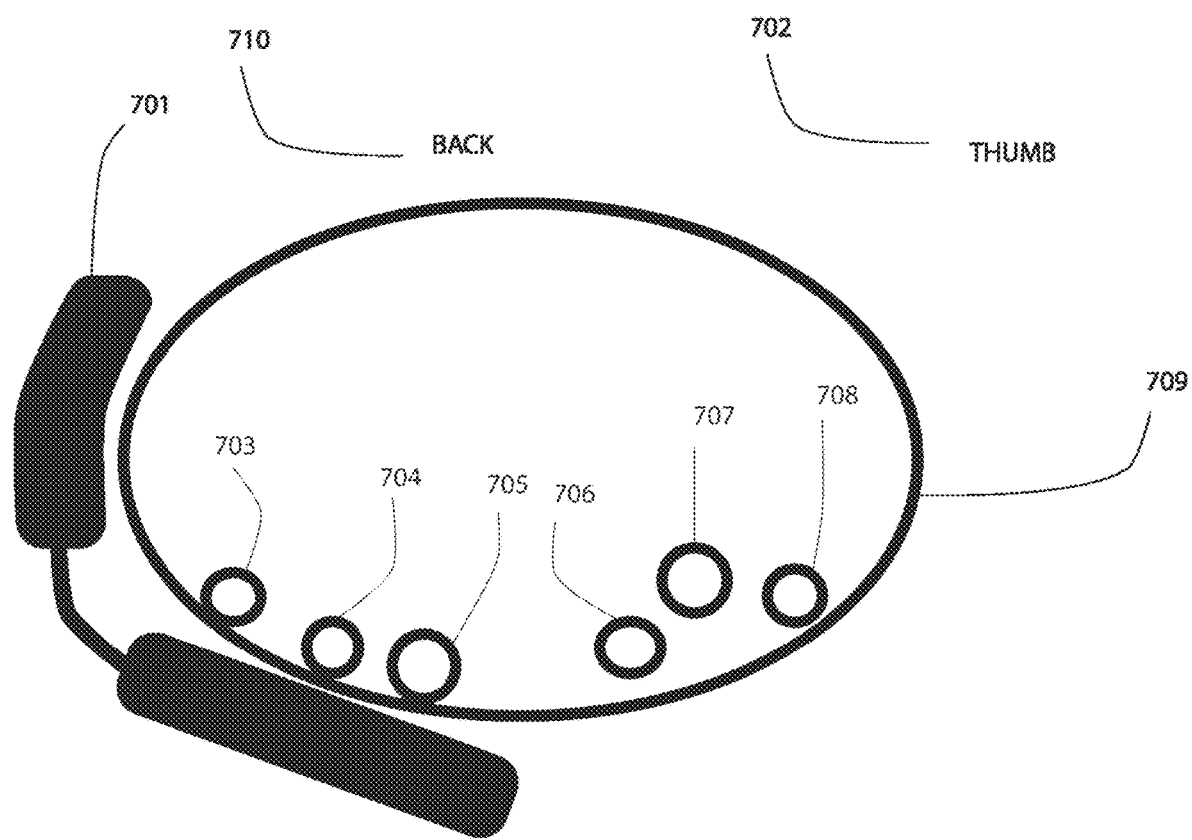
FIG. 7 is an illustration of the tendons in relation to the sensor module.

FIG. 7 is an illustration of the tendons in relation to the sensor module. The controller module comprises two connected elements 701. This module takes advantage of the anatomical configuration of the wrist and in particular of the disposition of the set of tendons that go to the fingers. There are three main tendons that are directly correlated to the movement of the index, middle finger and annular respectively the Flexor Carpi Ulnaris Tendon 703, Flexor Digitorum Profundus Tendon 704 and the Flexor Digitorum Superficialis Tendon 705. The sensor element of the controller module is located proximally to these tendons so as precisely measure the tension forces applied to them in order to get information on the finger movements. The controller module 701 resides near these three tendons avoiding the direct contact with bones in order to be as comfortable as possible. The controller module is configured to take into account the variability of the position of the tendons within the wrist among different people. In a preferred embodiment, four cantilever sensors are positioned to pick up the force signals applied to the tendons.

Figure 8:
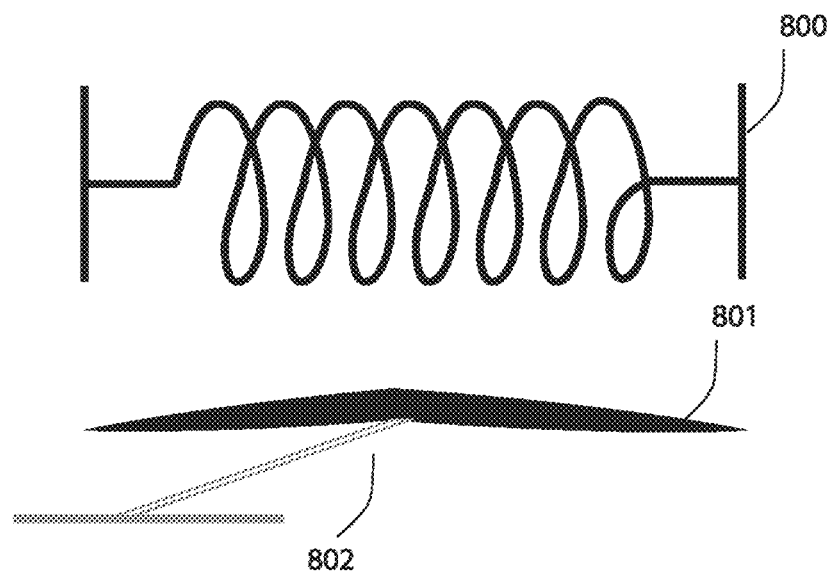
FIG. 8 is an illustration of tendon tensions on the cantilever sensor.
Figure 8:
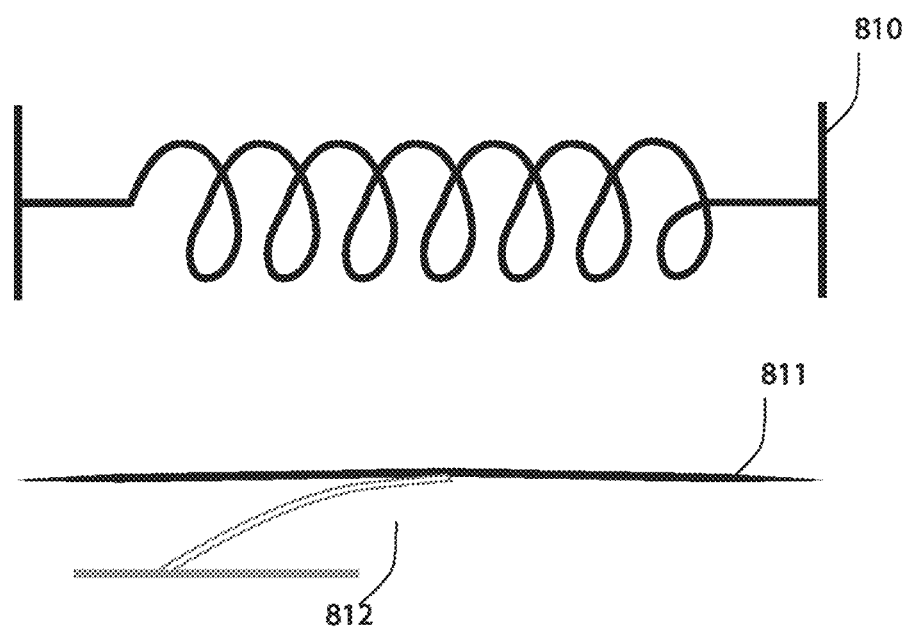

FIG. 8 is an illustration of the effect of tension applied to tendons on the cantilever sensor. When the tendon 801 is relaxed, it can be represented as a relaxed spring 800. The cantilever sensor 802 will measure the tension of the tendon. If no tension is applied then no bending of the cantilever sensor occurs and therefore no signal is produced.

When the tendon 811 instead is stretched, it is squeezed and becomes longer and can be represented as a pulled spring 810. In this situation the cantilever sensor 812 is bent. The more tension is applied to the tendon, the more the sensor is bent and therefore more signal is produced.

Figure 9:
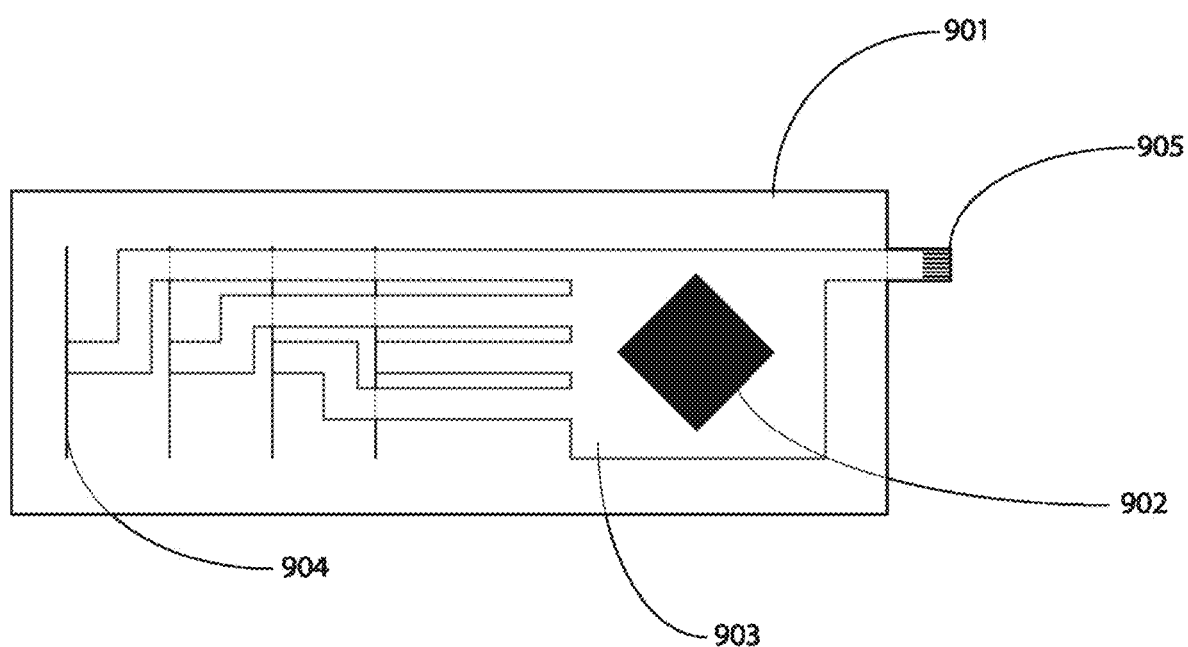
FIG. 9 is an illustration of an embodiment of the bottom view of the sensor.

FIG. 9 is an illustration of an embodiment of the bottom view of the sensor. In a preferred embodiment, the cantilever sensors 904 are embedded in a silicone element 901. A thin film PCB 903 is attached to the base of the silicone element 901 connects to the sensors 904 and includes a microcontroller 902 which processes the signal acquired from the cantilever sensors. A connector 905 attached to PCB 903 transmits the processed information to a communication module.

Figure 10:
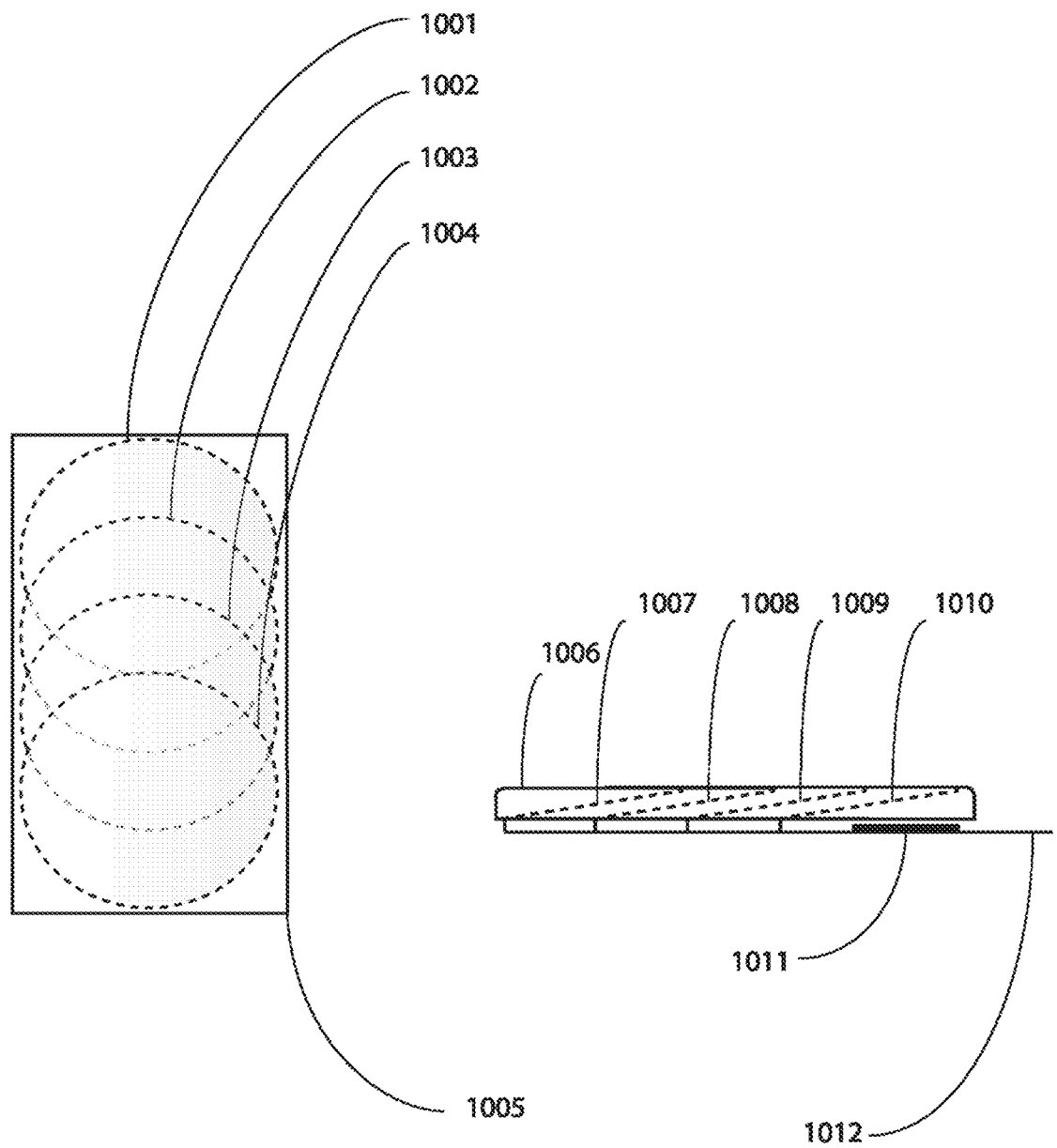
FIG. 10 is an illustration of an embodiment of the cantilever sensor.

FIG. 10 is an illustration of an embodiment of the cantilever sensor module. In a top view, a plurality of circular sensors 1001, 1002 1003 and 1004 are positioned in a linear pattern within a silicone matrix and are disposed so that the sensor areas overlap each other. In a lateral view, it can be observed that the sensors are cantilever at an angle in such a manner that only the tip of the sensor is attached to the PCB 1012.

Figure 11:
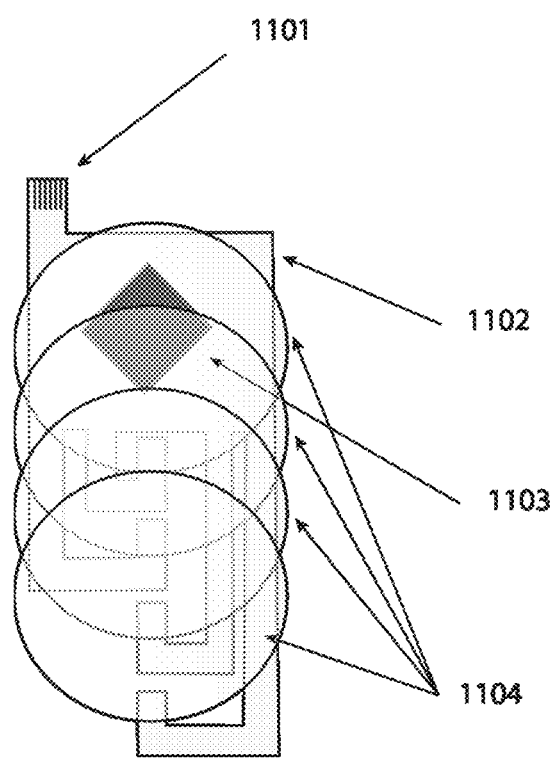
FIG. 11 is an illustration of a top view of an embodiment of the sensor.

FIG. 11 is an illustration of a top view of an embodiment of the sensor with the silicone removed. A plurality of sensors 1104 are positioned in a linear pattern, connected to a PCB 1102 comprising a microcontroller 1103 and a connector 1101.

Figure 12:
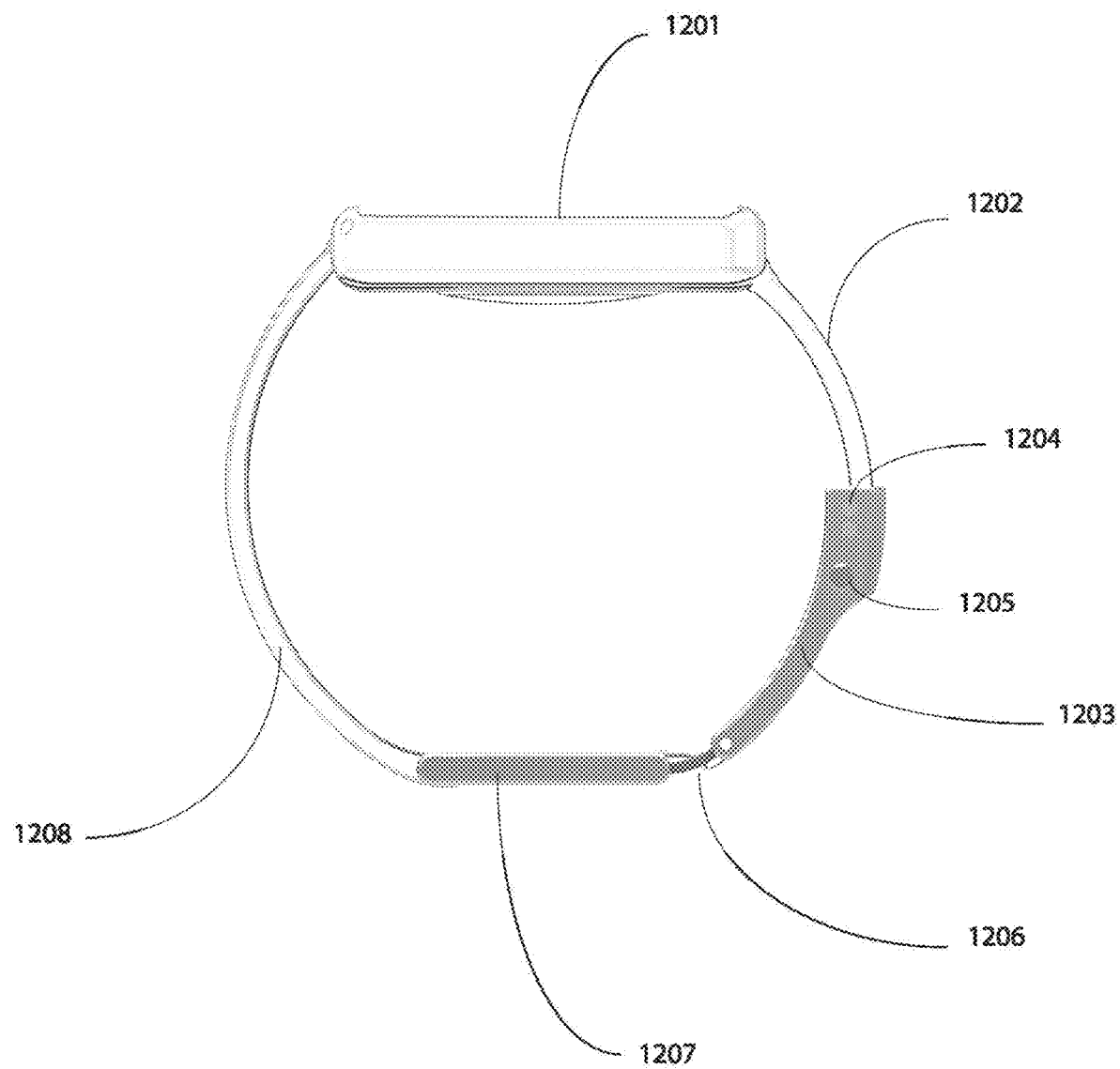
FIG. 12 is an illustration of the wrist-worn sensor built in in a watch strap.

FIG. 12 is an illustration of the wrist-worn sensor built in in a watch strap. A controller module comprising a bottom sensor and communication unit 1207, a connector 1206 and lateral battery module 1203 is attached to a watch face 1201 with two straps 1201 and 1208. In an embodiment, side pins for charging 1204 and a control button 1205 are disposed on the battery module 1203.

Figure 13:
FIG. 13 is an illustration of the inclined sensors of the disclosure.

FIG. 13 is an illustration of the effect of the inclined cantilever sensors of the disclosure. The piezoelectric sensors depending on where they are stressed they create different signals. In sensor arrangements of the prior art, large sensing areas create uncertainly in the location of the source of tension in the tendons and therefore in the measure of the actual movements of tendons, muscles and fingers. In the cantilever sensor design of the disclosure, only the tip of each sensor can be stressed, making the detection of the source of the signal highly accurate and more specific as to which tendon is being stressed. The cantilever and overlapping sensor layout design also allows for more sensors to be packed in a limited space increasing sensitivity of the sensor to small changes in tendon stresses.

Figure 14:
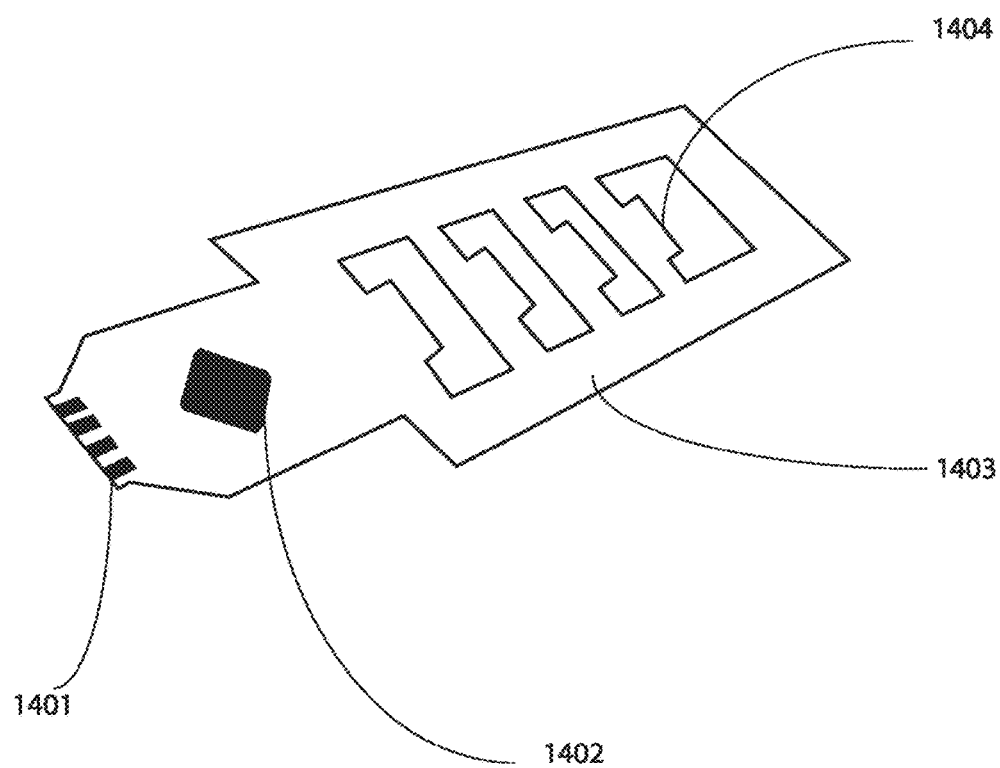
FIG. 14 is a perspective view of an embodiment of a flexible sensor PCB.

FIG. 14 is a perspective view of an embodiment of the electronic circuit of the sensor of the disclosure. The electronic circuit comprises a flexible thin film PCB 1403, a microcontroller 1402, a connector 1401 and angled wings 1404 that penetrate the silicone and to which the cantilever piezoelectric sensors are attached.

Figure 15:
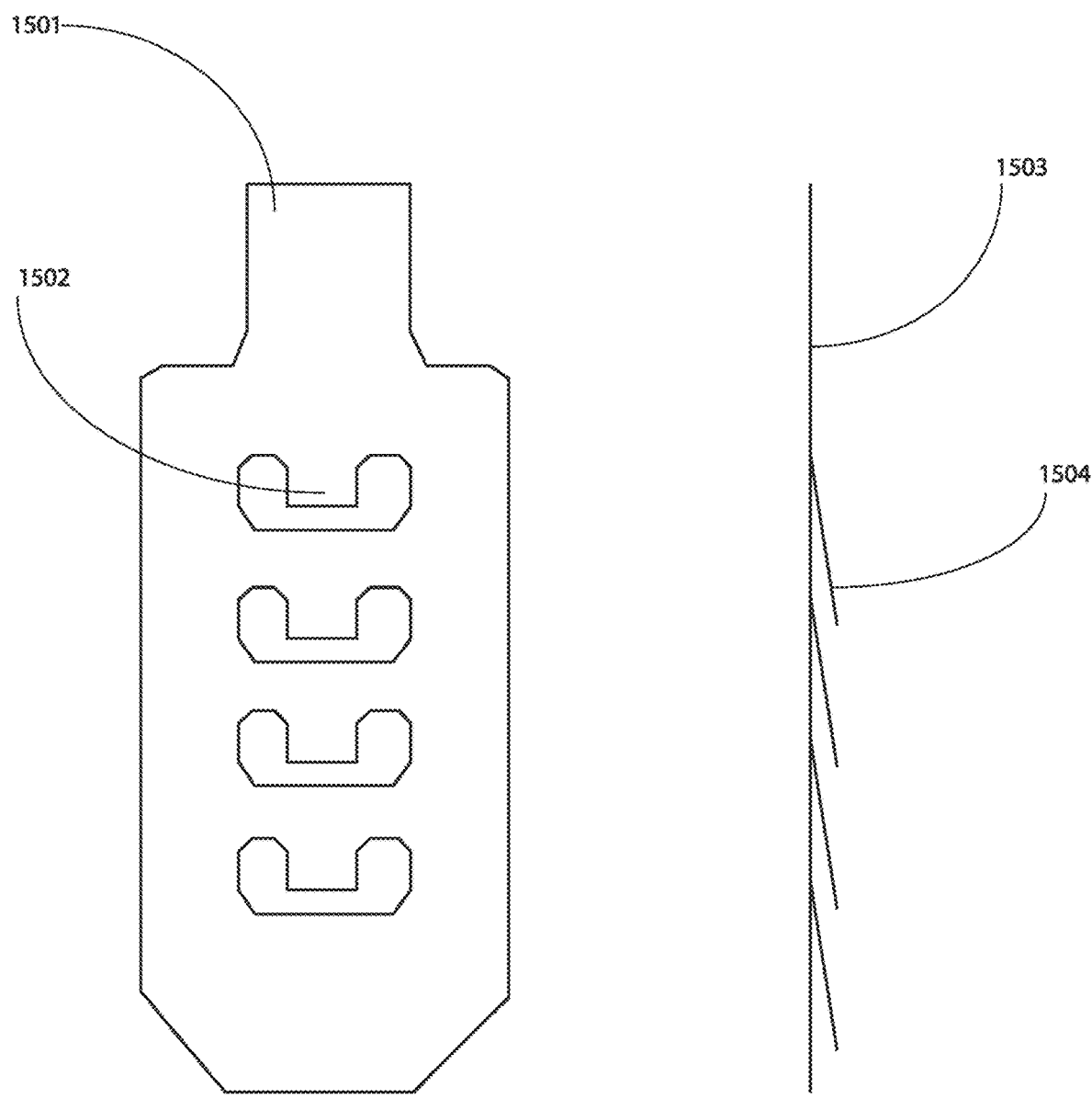
FIG. 15 illustrates top and lateral views of an embodiment of the PCB.

FIG. 15 illustrates the angled wings 1502 in top view 1501 of the PCB and the same wings 1504 in side view 1503 of the PCB.

Figure 16:
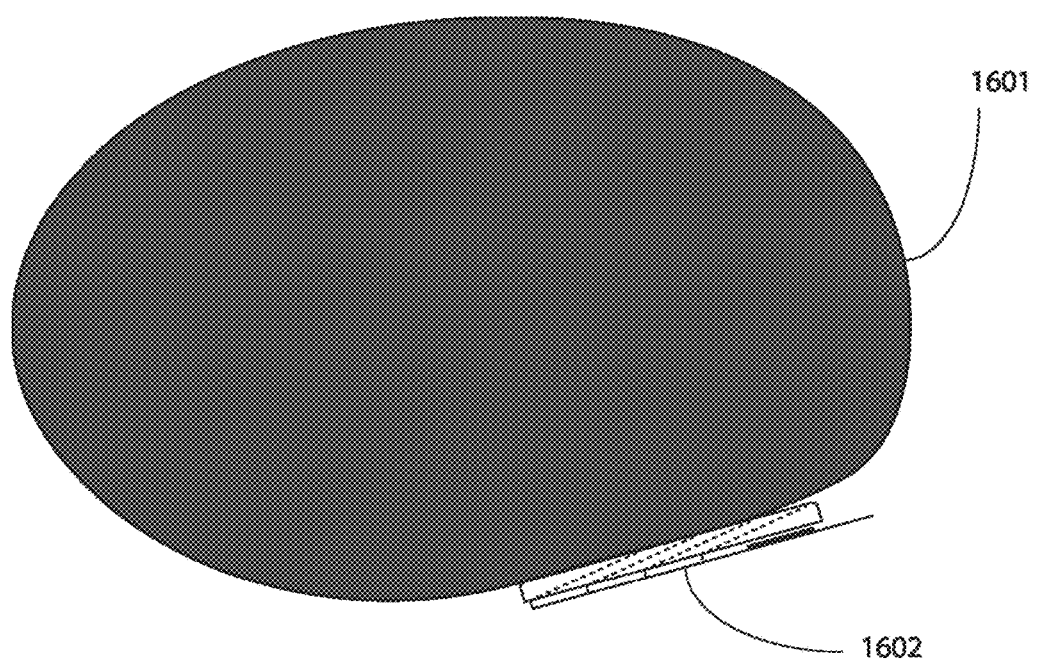
FIG. 16 illustrates the relative position of the sensor to the wrist.

FIG. 16 illustrates how the sensor module 1602 is placed against the wrist 1601 so as to optimally capture the tension applied to the wrist tendons.

Figure 17:
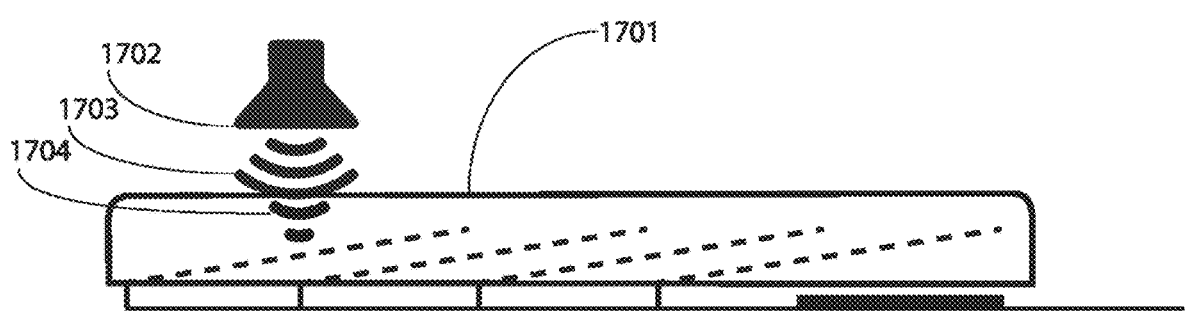
FIG. 17 illustrates the effect of the silicone on low amplitude high frequency stresses.

FIG. 17 illustrates the effect of the silicone material on low amplitude high frequency stresses. The silicone material 1701 filters out low amplitude high frequency mechanical stresses 1703 from source 1702 preventing them from form reaching the piezoelectric materials. In this case the pressure 1704 is damped and filtered and no signal is produced in the output.

Figure 18:
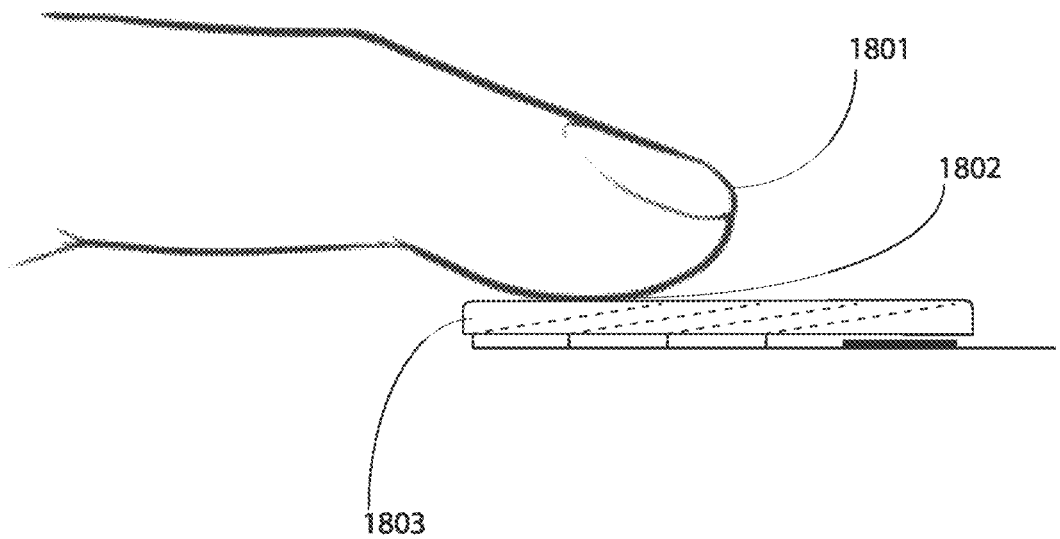
FIG. 18 illustrates the effect of finger pressure on the sensor.

FIG. 18 illustrates the effect of finger pressure on the sensor. Finger 1801 applies pressure on sensor module 1803. The plurality of cantilever sensors allows the sensor to detect the location 1802 of the applied pressure on the sensor 1803.

Figure 19:
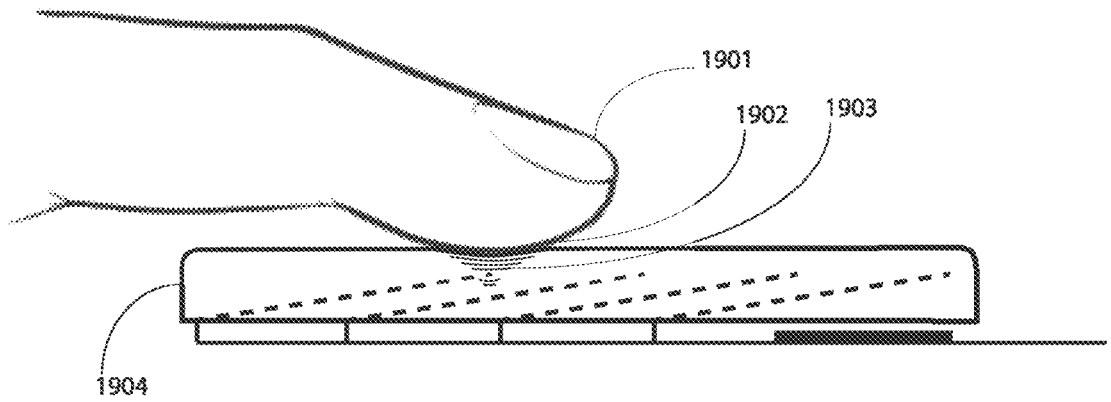
FIG. 19 illustrates the effect of high amplitude low frequency stresses on the sensor.

FIG. 19 illustrates the effect of high amplitude low frequency stresses on the sensor. The sensors are embedded in a silicone material 1904, with a chemical composition, shape and size specified so as not to damp the signal generated by a source of high amplitude low frequency stress 1903 such as produced by pressure 1902 of a finger 1901.

Figure 20:
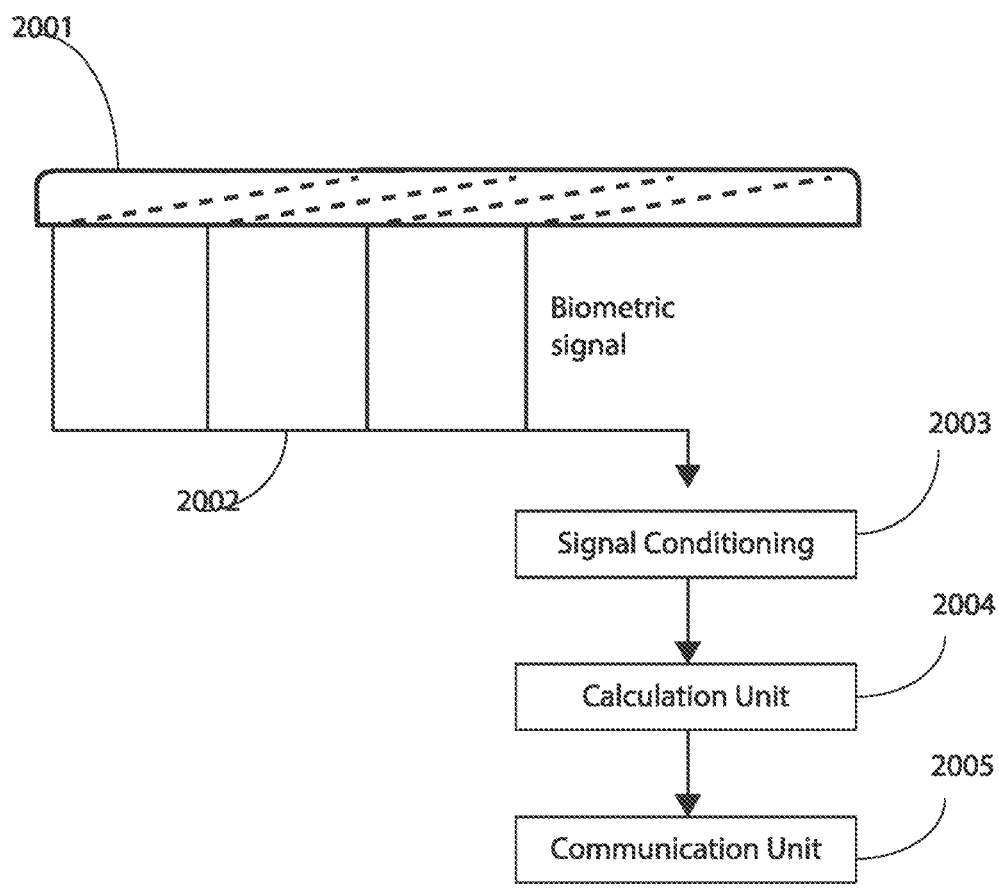
FIG. 20 illustrates the information flow of a biometric signal on the sensor.

FIG. 20 illustrates the information flow of a biometric signal on the sensor. An analog biometric signal 2002 will be transmitted from the sensor module 2001 to a signal conditioning unit 2003 where the signal amplitude will be adjusted before further transmission to a calculation unit performing analog to digital conversion and digital signal processing into commands before final transmission to a communication unit 2005 where the commands will be broadcast to an external device.

Figure 21:
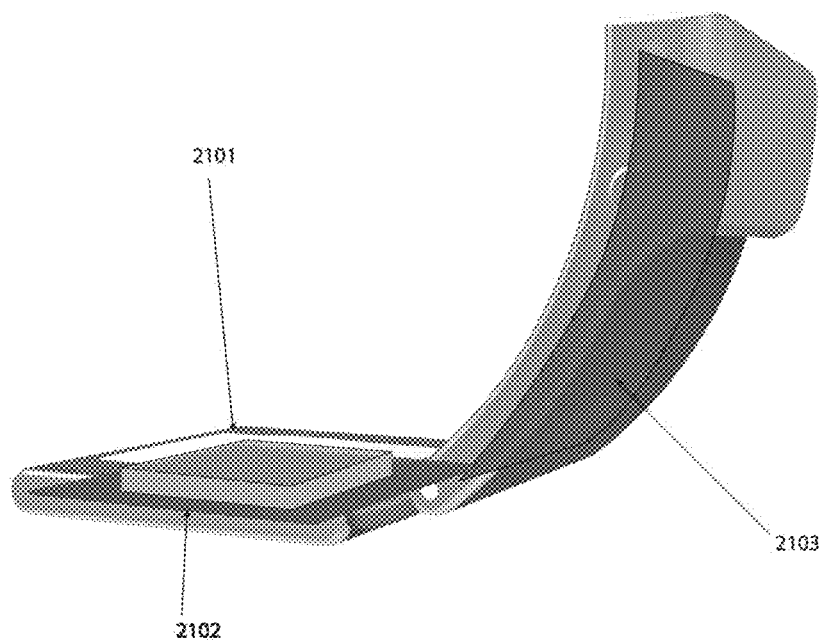
FIG. 21 illustrates a 3D model of the main parts of the sensor module.

FIG. 21 illustrates a 3D illustration of the main electronic parts of the controller. The controller comprises the sensor module 2101, the communication unit 2102 and battery 2103.

Figure 22:
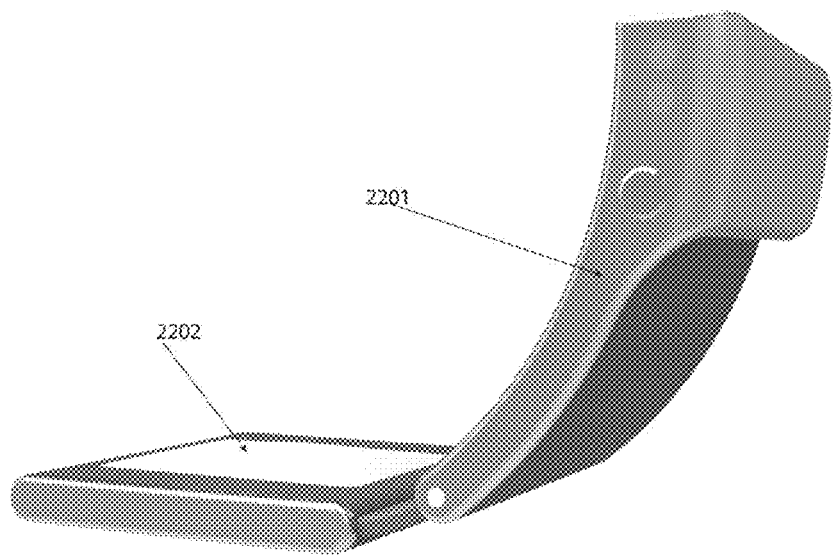
FIG. 22 illustrates another 3D view of the sensor module.

FIG. 22 illustrates a 3D view of the controller with lateral module 2201 comprising the battery and external controls and the bottom module 2202 with the sensors and electronics. The sensor array within the controller can be automatically turned off in order to save power. The micro-controller can be set in rest-mode at the same time. This is particularly useful in wireless implementations of the controller where an onboard battery (replaceable or chargeable), fuel cell, photovoltaic power cell, etc., is used to energize selected sensor nodes and associated circuitry.

Figure 23:
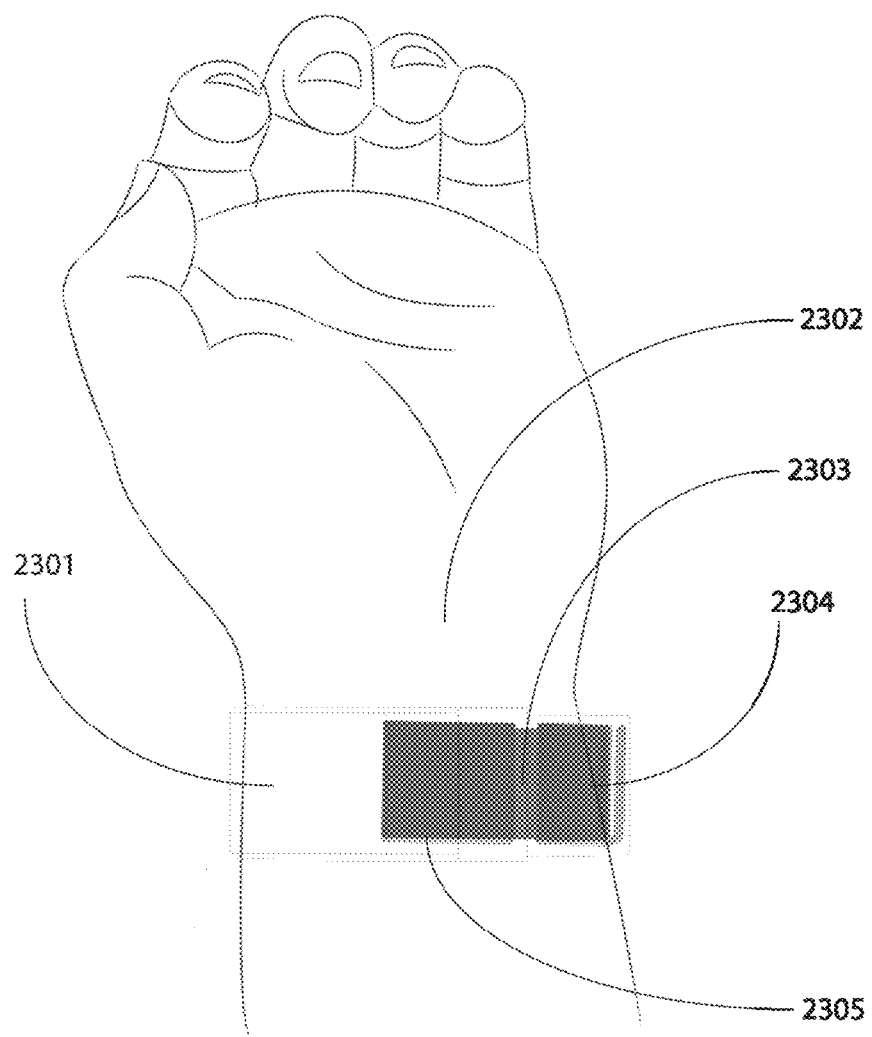
FIG. 23 illustrates the position of the sensor modules relative to the wrist.

In order for a user to wear the module, it can be attached to an existing watchband or bracelet. This improves the usability of the controller, because a user is not requested to replace his wristwatch, since he can just attach the module to its own wristwatch and hide it under its watchband. FIG. 23 illustrates the position of the lateral and bottom modules relative to the wrist. Bottom module 2305 and lateral module 2304 are attached together via connector 2303 and further held against the wrist 2302 with a watchband 2301.

Figure 24:
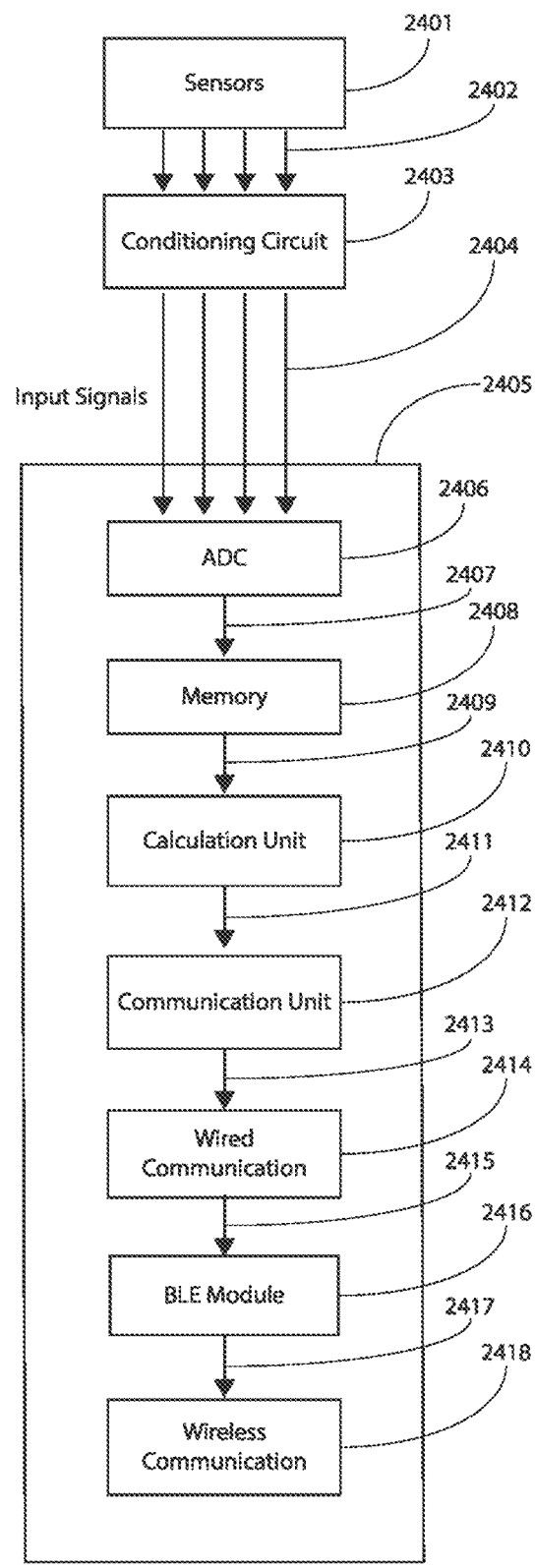
FIG. 24 illustrates the data processing elements of the sensor.

FIG. 24 illustrates the data processing elements of the sensor. Pressure sensor 2401 comprises a silicone matrix with a linear array four piezoelectric sensors elements embedded inside. The following processing steps are performed by the controller:
  a) the linear array produces four raw analog signals;
  b) a conditioning circuit adjusts the raw signal to improve the signal to noise ratio;
  c) an analog to digital converter unit converts the adjusted analog signal into a digital signal and produces elaborated results;
  d) a memory module stores the input signals and the elaborated results;
  e) a calculation unit runs a classification algorithm and produce results of the classification and diagnostic parameters;

f) a communication unit sends the results to an external device for communication.

In wireless implementations of the controller communication between the controller and one or more computing systems is accomplished via conventional wireless communications protocols such as, for example, radio frequency (RF) communications, infrared (IR) based communications, Bluetooth, etc. In this case, the controller includes one or more wireless transmitters, and optionally one or more receivers, for directly interfacing with one or more computing devices, or interfacing with one or more "hubs" that serve as intermediaries for interfacing the controller with one or more computing devices. In a preferred embodiment, a Bluetooth low energy module, able to broadcast wirelessly the information is used for communication with external devices.

It other embodiments of the controller, communications are implemented using wired connectors, such as, for example, by including an integrated USB that provides the power for the sensor nodes and provides a communications pathway between the controller and one or more external devices. As in the wireless embodiments, in wired embodiments, the controller communicates either directly with computing devices, or with those computing devices via an intermediary hub.

In addition, given the various wired and wireless configurations of the controller described above, it should be understood that hybrid embodiments using various elements of both the wired and wireless configurations are enabled. For example, in one embodiment, a power cable provides operational power, while wireless communications are then enabled by one or more transmitters/receivers integrated into, or coupled to, the controller. For example, in these types of hybrid embodiments, the power cable (e.g., a power cable connected to a transformer or other power source, or a USB power cable connected to a computing device or transformer, etc.) provides operational power to the controller, while the wireless transmitters/receivers provide communications between the controller and one or more computing devices or intermediary hubs within wireless range of the controller.

Figure 25:
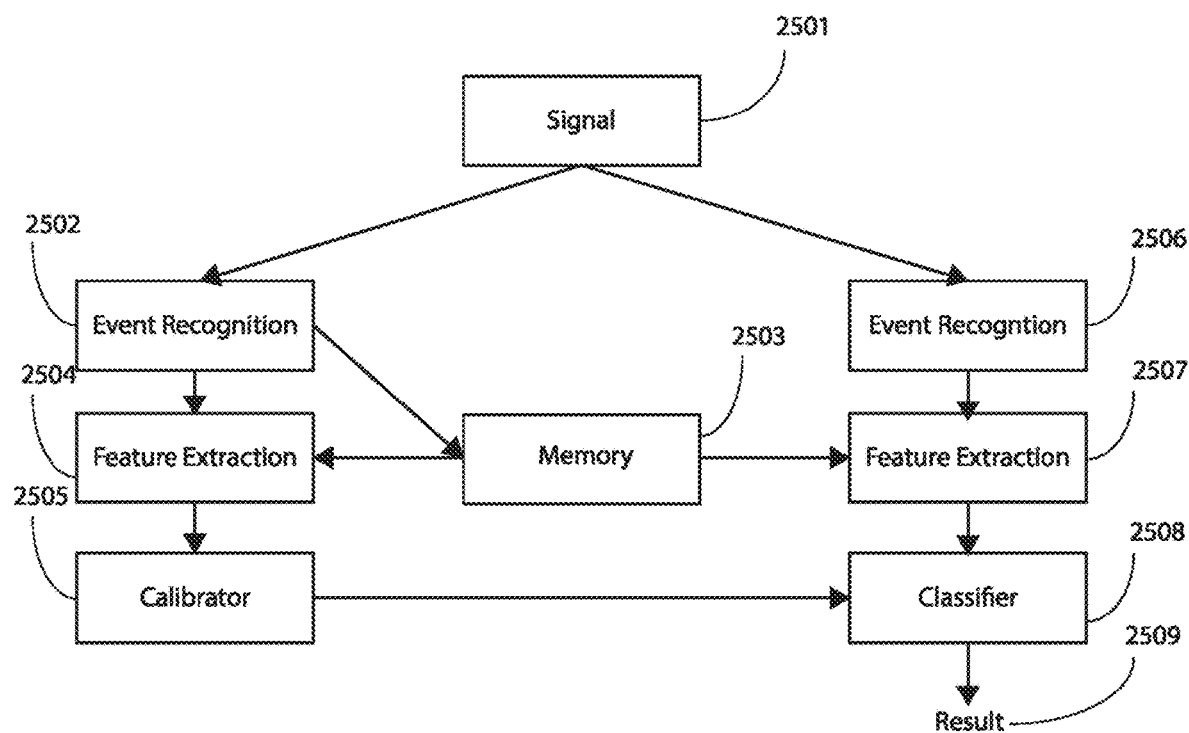
FIG. 25 illustrates a process for classification of finger motions.

FIG. 25 illustrates a process for classification of finger motions.

a) An event recognition module checks the signal stream until it detects that an event has happened. An event is anything different from the base noise.

b) When an event is detected, the module sends the registration of the event to a feature extraction module and goes back checking the signal stream.

c) The feature extraction module extracts meaningful parameters from the signals.

d) A calibration module gathers all the parameters coming from the feature extraction module and creates another set of parameters that allows a classifier module to classify the event.

e) The classifier module is able to recognize in which class the incoming parameters belong to. To do that it needs another set of parameters coming from the calibration module. The result of the classification is the name of the class.

Due to the wide heterogeneity of the human body, a calibration phase typically precedes the use of the device. The calibration is repeated periodically, in order to ensure the best performances. In the event that the classifier needs to perform a calibration, a calibration process is launched first. The memory module stores the old events recorded during the calibration. When requested by the feature extraction module, the memory module recalls the old events.

Figure 26:
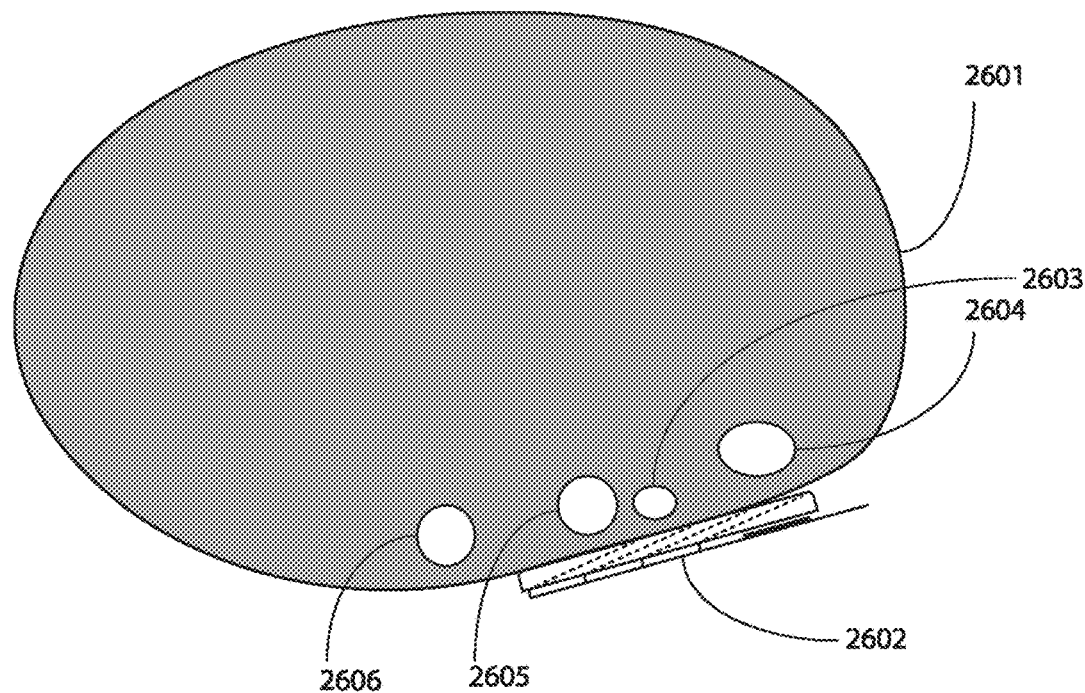
FIG. 26 illustrates the measurement of tendon tensions by the sensor.

FIG. 26 illustrates the measurement of tendon tensions by the sensor array. The sensor array while being indirectly in contact with the tendons keeps a dynamic equilibrium of the stresses applied to the wrist tendons. In the same way a finger can sense how much a guitar cord is stretched by touching the cord, the sensor array is constantly measuring the tension of the tendons and the changes in tension due to the finger movements and gestures. Each tendon creates pressure at different parts of the sensor causing a particular pattern of signals. The sensor array typically collects information from four main tendons including the Flexor Ulnaris Tendon 2603, the Flexor Digitorum Profundus Tendon 2604, the Flexor Digitorum Tendon 2605 and the Palmaris Longus Tendon 2606.

Figure 27:
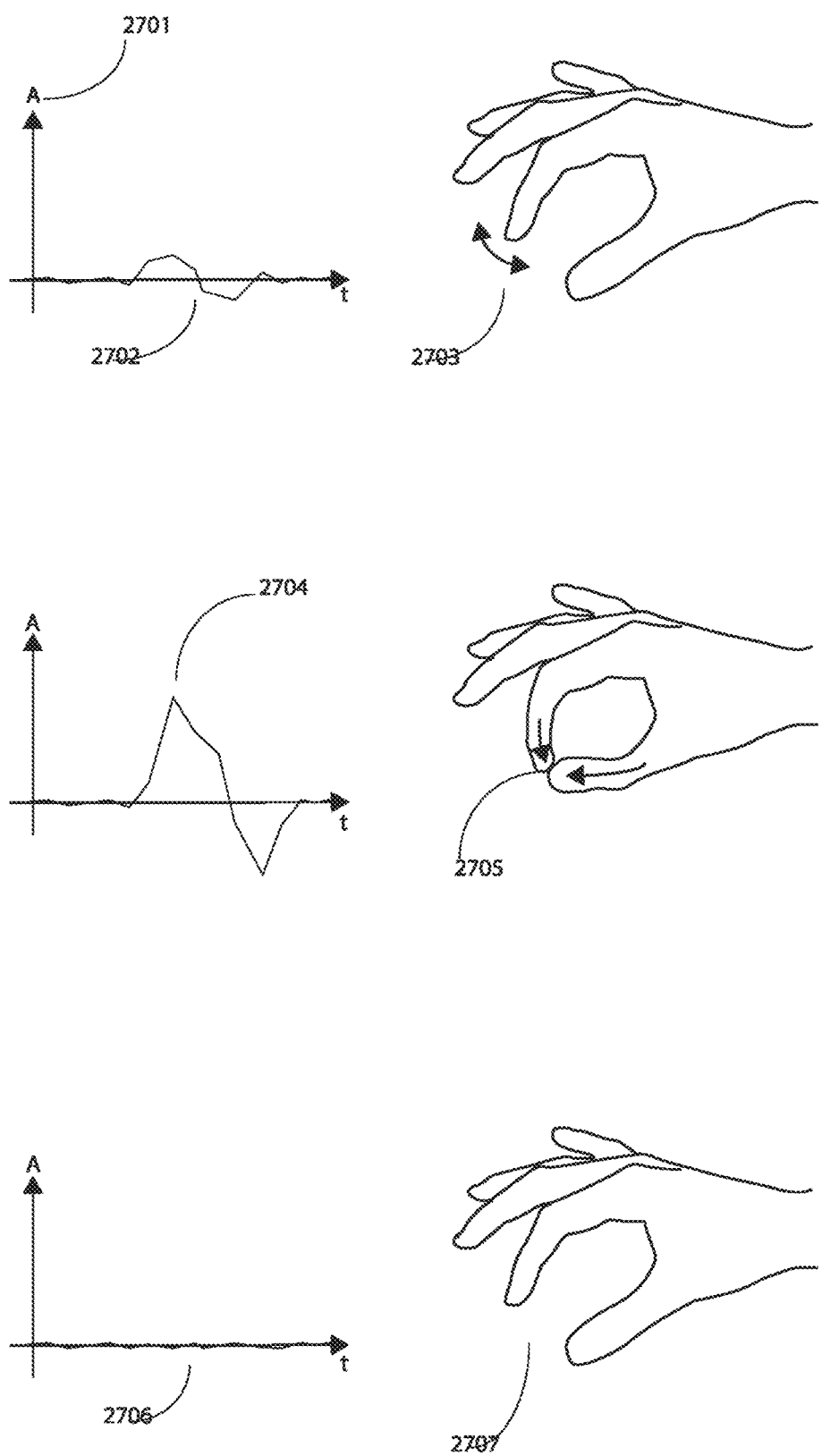
FIG. 27 illustrates various signals resulting from specific finger movements.

FIG. 27 illustrates various signal patterns resulting from specific finger movements. The first graph 2701 illustrates the signal pattern 2702 from one of the sensors from the index finger moving up and down 2703. The second graph illustrates the signal pattern 2704 from one of the sensors from a pinching movement between the thumb and index finger. The third graph illustrates the signal pattern 2706 from one of the sensors from the fingers being still.

Figure 28:
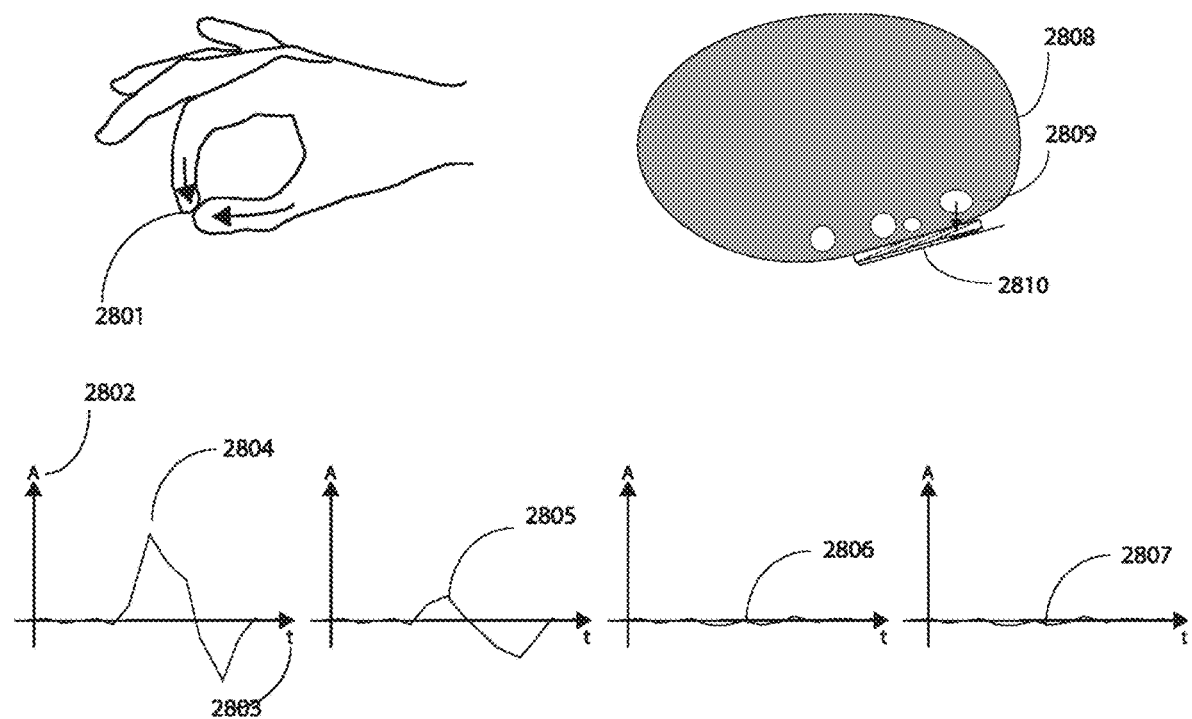
FIG. 28 illustrates signals from various sensors from a specific gesture.

FIG. 28 illustrates signals from multiple sensors in the array from a pinching gesture 2801 between the thumb and index finger. The four plots illustrate how each sensor in the sensor array 2810 is affected by the tendon tension forces. The wrist section view 2808 illustrates how a tendon applies pressure on a particular sensor 2809 of the sensor array 2810.

Figure 29:
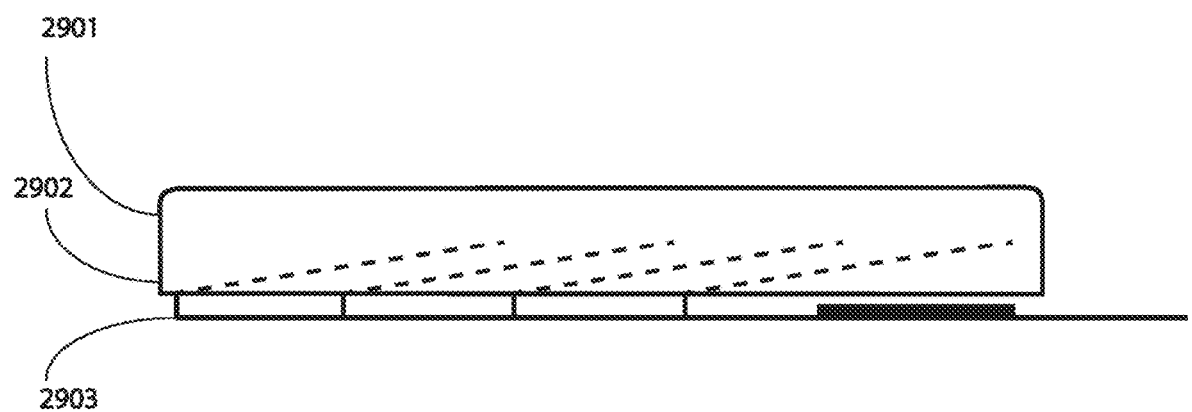
FIG. 29 illustrates an embodiment of the configuration of the sensor.

FIG. 29 illustrates an embodiment of the configuration of the sensor. A first layer 2901 made from an elastomeric material such as silicone rubber filters out low amplitude signals and provides comfort against the skin. When the sensor array touches the wrist, the elastomeric material blocks noise from reaching the sensor array and bends slightly and changes shape to ensure close contact with the wrist. The second layer comprises piezoelectric elements embedded in an elastomeric material providing a robust sensing structure (the piezoelectric material is made of ceramic and is really fragile alone). The third layer consists of a thin film PCB typically made from a thin flexible plastic or metal foil material. The three layers combine to form a compact and flexible sensor module.

Figure 30:
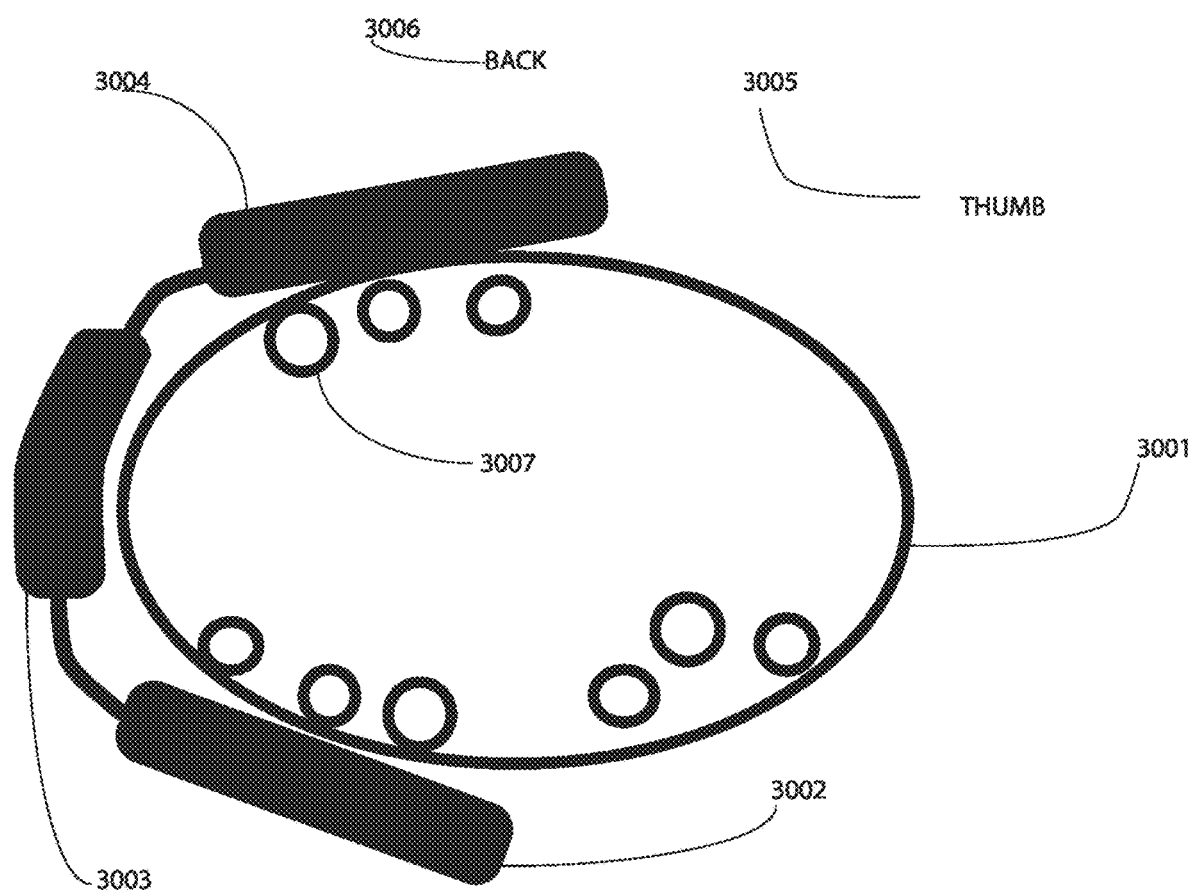
FIG. 30 illustrates another embodiment of a sensor with two sensor modules.

FIG. 30 illustrates another embodiment of a controller with two or more sensor modules, one module for the wrist tendons 3002 and a second sensor module 3004 for the tendons controlling finger extension. A third lateral sensor 3003 may be provided as well for additional accuracy.

Figure 31:
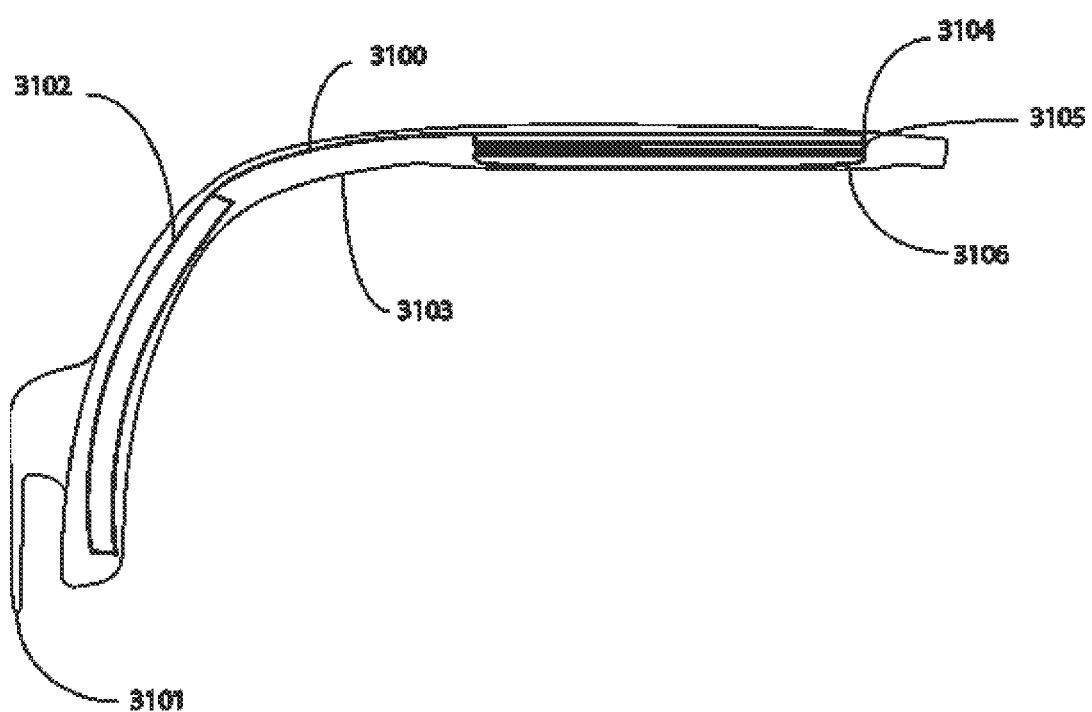
FIG. 31 illustrates a first embodiment of the sensor.

FIG. 31 illustrates a first embodiment of the sensor module. A battery 3102 is attached to a first electronic circuit 3104 comprising a Bluetooth module, Bluetooth antenna and other electronic components, via connection 3100. Sensor 3106 is attached to electronic circuit 3104 via a thin film PCB 3105. A clip 3101 allows the sensor module to be attached to a watchband or fitness band. The whole sensor may be embedded in a silicone or other elastomeric material 3103 for water resistance and greater comfort.

Figure 32:
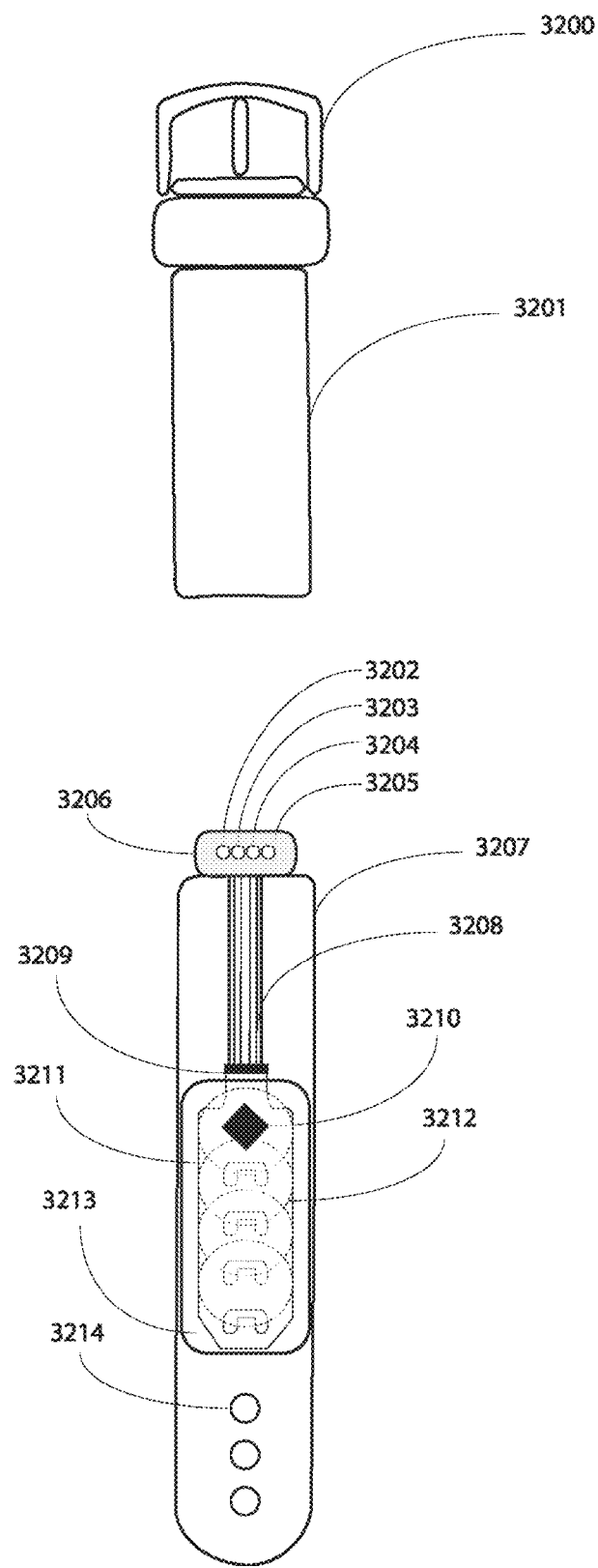
FIG. 32 illustrates an embodiment of sensor module as part of a watchband.

FIG. 32 illustrates an embodiment of sensor module as part of a watchband. The sensor module comprising the sensor array 3212, thin film PCB 3211 and microcontroller 3210 embedded in elastomeric material 3213 is directly connected to a smartwatch via a wired connection 3208 eliminating the need for a separate power supply. The sensor and electronics are directly mounted on one side of a watchstrap 3207. A custom connector 3206 to the smartwatch comprises a ground connection 3202, a power supply connection 3203 and communication channel connections 3204 and 3205.

Figure 33:
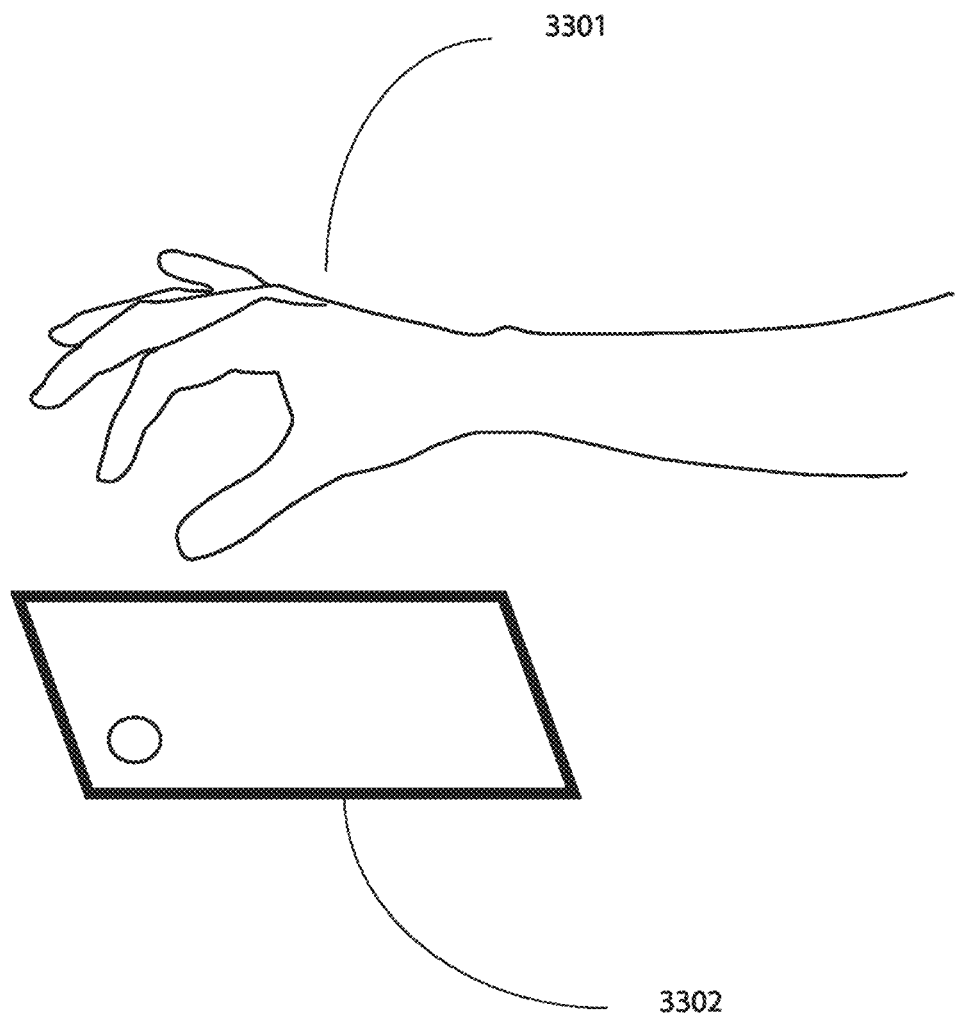
FIG. 33 illustrates a method for calibrating the sensor using a camera.

FIG. 33 illustrates a means of calibrating the sensor module using computer vision. Such a calibration method can gather more information on how the user is performing the gestures and on the user hand characteristics taking advantage of another device's camera, such as a smartphone camera in order to monitor the hand while performing the calibration.

Figure 34:
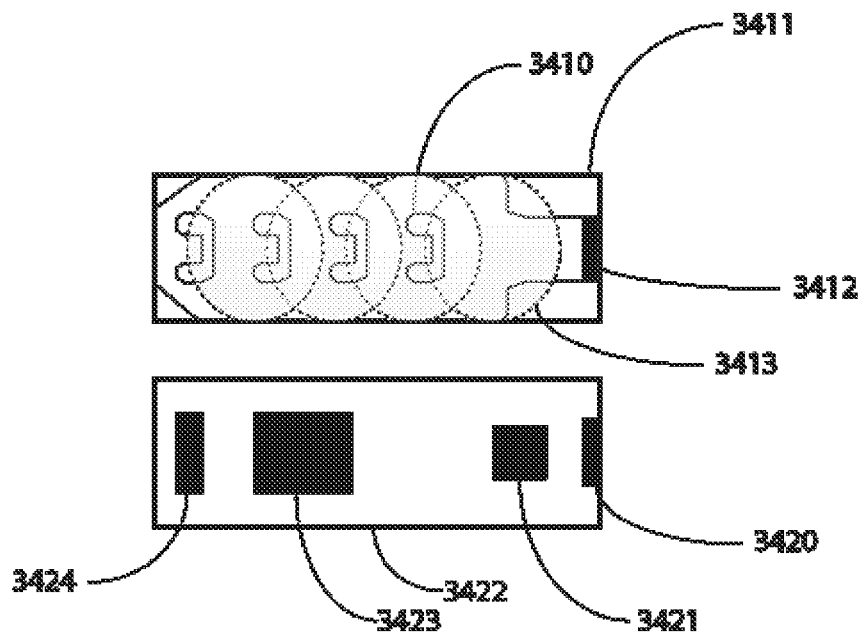
FIG. 34 illustrates an embodiment of the electronics and sensor assembly.

FIG. 34 illustrates an embodiment of the electronics of the sensor module. Flexible PCB 3410 connects piezoelectric elements 3413 embedded in elastomeric material 3411 to connector 3412. Microcontroller 3421, Bluetooth chip 3423, Bluetooth antenna 3424 are connected to rigid thin PCB 3422 and connector 3420.

Figure 35:
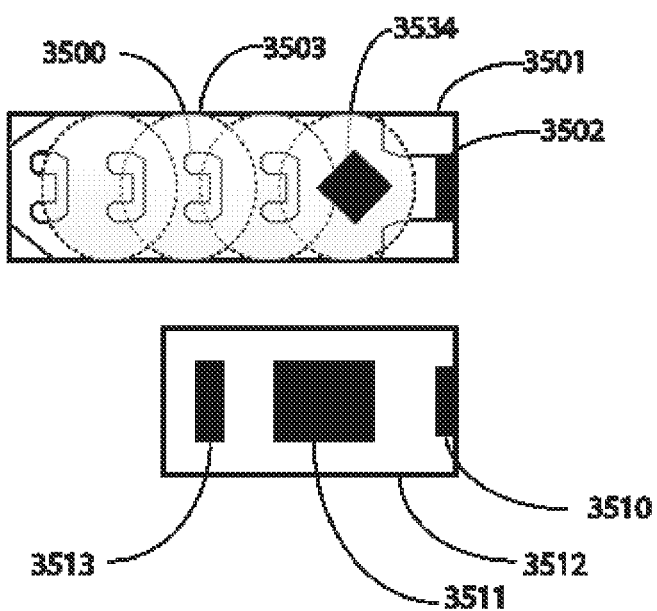
FIG. 35 illustrates another embodiment of the electronics and sensor assembly.

FIG. 35 illustrates another embodiment of the sensor and electronics assembly with microcontroller 3534 mounted on the thin film flexible PCB 3530 together with sensor array 3533 embedded in elastomeric material 3531 and attached to connector 3502. Bluetooth chip 3511, Bluetooth antenna 3513 and electronics connector 3510 are mounted on the rigid thin PCB 3512.

Figure 36:
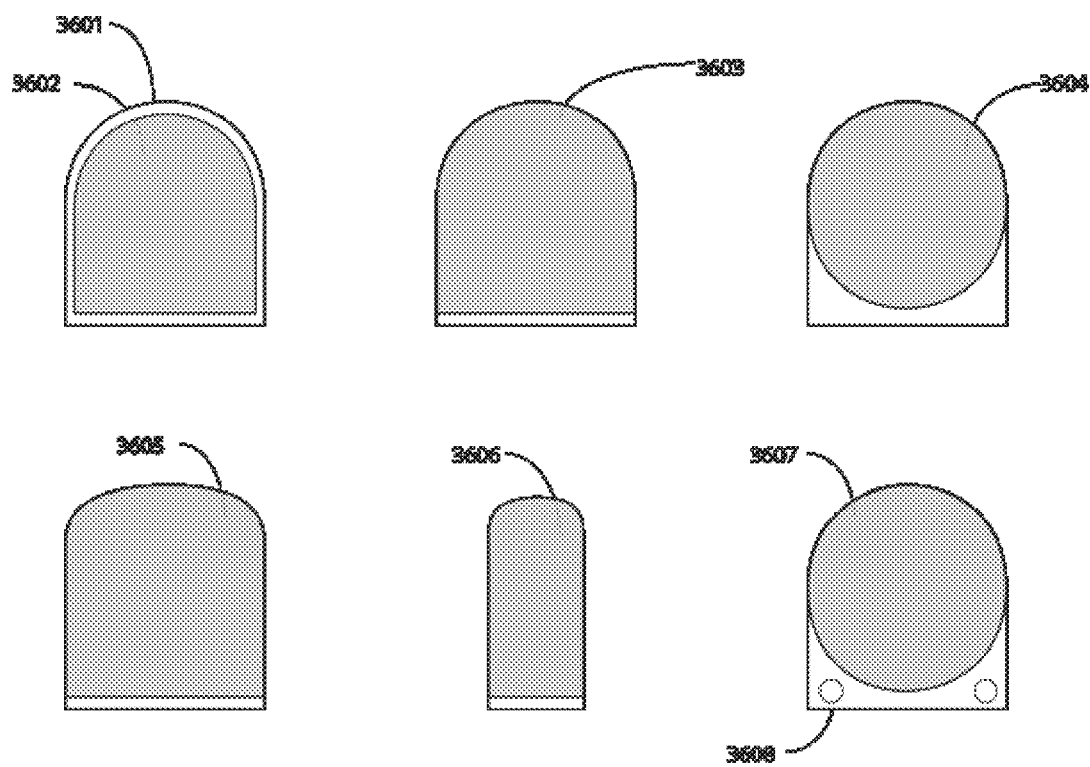
FIG. 36 illustrates various cantilever sensor embodiments.

FIG. 36 illustrates various cantilever sensor embodiments. A key feature present in all these drawings is the straight line on the bottom. This shape provides strong stability to the PCB layer underneath, higher precision for assembly and easier manufacturability. All the sensors are made of two layers: a metal layer and the piezoelectric ceramic layer. Typical width of the sensors is 12 mm although other widths are contemplated by the disclosure. The 3601 sensor version is similar to the off-the-shelf piezoelectric sensor, preserving a border of plain metal that allows a good placement of the glue that attaches the two layers. The 3603 sensor version comprises an enlarged ceramic plate, for greater sensitivity increases. The 3604 sensor version retains the usual shape of the ceramic plate attached to a larger and more stable metal plate. The 3605 sensor version is a variation of 3603 where the curvature on the top corners is smaller, allowing for a wider ceramic plate. The 3606 sensor version is half the width of the 3605 sensor width of 12 mm. This version has a lower sensitivity for the same bending angle, although the elongated shape allows for greater bending resulting in the same signal amplitude for the same pressure applied. Its smaller dimension allows for a greater number of sensors in a given size array improving the spatial resolution of the sensor array. The 3607 sensor is a variation of 3604 sensor. The two holes along the bottom make the sensor easier to handle during manufacturing and provide a more stable attachment to the final device.

As discussed herein, the sensors of the controller are applied coarsely, without an expert present to ensure precise placement. For example, in the aforementioned wristband configuration, an end-user attaches the armband on the wrist, such that sensors are located next to the wrist skin. Given this approach, the basic process of "installing" the controller can be implemented in a number of user-friendly ways. In an embodiment, initial positioning of the controller is accomplished using a process such as the simple three step process illustrated below: 1) The user puts the wristband, wristwatch, or other controller in a coarsely approximate location where the device is intended to be placed. For example, would be coarsely placed somewhere on the users wrist. The system would then be activated or turned on (unless the system was already activated or turned on); 2) The user would then make coarse manipulations to the initial positioning of the device, such as, for example, rotating the wristband, while receiving simple feedback about signal quality (such as a simple "meter" on a computer screen, a sound emanating from the device, or speech cues to direct the user with respect to specific motions); 3) Finally, the user would make fine adjustments to the position or orientation of the device (e.g. rotate and/or move the position of the controller) until a simple goal is achieved, such as "meter goes above level 5," "sound stops", "vibration stops", etc.

In various embodiments, the feedback provided to the user during this simple adjustment process is visual (e.g., a bar or meter on a computer screen, on a portable music player, or on a small on-board LCD or series of one or more LEDs or lights), auditory (e.g., a noise that gets quieter as signal quality increases, or a voice saying "keep turning, keep turning, perfect!"), or haptic (e.g., the controller vibrates or electrically stimulates one or more areas of the user's skin while the user should continue to adjust the device and stops vibrating or electrically stimulating the user's skin when the signal quality is adequate.

The wrist-worn controller provides HCI capabilities based on signals generated by the body in response to the contraction of one or more tendons connected to the fingers. As such, it should be clear that the controller is capable of being used for any of a number of purposes. For example, these purposes include interaction with conventional application such as interacting with a computer operating system by moving a cursor and directing simple object selection operations (similar to using a computer mouse to select an object), wired or wireless game controllers for interacting with game consoles or with video games operating on such consoles, control of pan-tilt-zoom cameras, interaction with home automation systems such as audio, video, or lighting controls, etc.

Other obvious uses for the controller include local or remote control of robots or robotic devices, such as, for example, using a glove with embedded sensor nodes on the wrist to control a remote robotic hand wielding tools or medical instruments.

The controller can be fitted with an additional accelerometer in order to measure the movements of the whole hand in the space, in order to have more information to send. The controller described herein is operational for interfacing with, controlling, or otherwise interacting with numerous types of general purpose or special purpose computing system environments or configurations, or with devices attached or coupled to such computing devices. For example the wristwatch can act as a "hub" in the case, as a wireless intermediary between one or more of the sensor nodes and a second device.

In one embodiment, the controller communicates with a computing device. Such computing devices include, but are not limited to, personal computers, server computers, handheld computing devices, laptop or mobile computers, communications devices such as cell phones and PDA's, multiprocessor systems, microprocessor-based systems, set top boxes, programmable consumer electronics, network PCs, minicomputers, mainframe computers, video media players, in-vehicle computing systems (e.g., automotive computer system), etc.

As noted above, computing devices such as those described herein operate either in response to user gestures recognized via one or more controller. However, in various embodiments, such computing devices also provide computing power for operations such as the initial calibration. In addition, such computing devices may also act as hubs or intermediaries to facilitate communications between the controller and one or more other computing devices or attached mechanisms. In general, such computing devices include at least some minimum computational capability along with some way to send and receive data. In particular, the computational capability is generally given by one or more processing unit(s), and may also include one or more GPUs. Note that that the processing unit(s) of the general computing device of may be specialized microprocessors, such as a DSP, a VLIW, or other micro-controller, or can be conventional CPUs having one or more processing cores, including specialized GPU-based cores in a multi-core CPU.

In addition, the computing device may also include other components, such as, for example, a communications interface. The computing device may also include one or more conventional computer input devices (such as a microphone or microphone array for receiving voice inputs). The simplified computing device may also include other optional components, such as, for example one or more conventional computer output devices (such as audio and/or video output devices). Finally, the computing device may also include storage that is either removable and/or non-removable. Note that typical communications interfaces, input devices, output devices, and storage devices for general-purpose computers are well known to those skilled in the art, and will not be described in detail herein.

After band-pass filtering the signals in case the amount of data is too great, it can be analyzed by a real-time PCA. The PCA permits to reduce the amount of data and focus on the relevant signals. The signals are then analyzed by a feature extractor. The feature extractor analyzes the signals in order to obtain a set of features that robustly describe the signals and that can be compared with other signal features coming from other finger movements and gestures. The comparison is usually made in order to classify the signal and recognize the associated finger gesture. The feature can be a time domain feature (amplitude, ratio between the signal amplitude and other prerecorded signals amplitudes, number of lobes, number of zero-crossings, time length of each lobe, time length of each movement, correlation with other prerecorded signals, difference between the signal and other pre- recorded signals). The feature can be a frequency domain feature (power of the spectrum, power of a range of frequencies, ratio between amplitude of certain range of frequencies, wavelet features).

A preferred system for power management is described as follows. The embodiment is normally set in sleeping mode, the signal acquisition is not active, the microcontroller is set in low power consumption. The microcontroller wakes up from the sleeping mode thanks to an external signal triggered by a mechanical button, which is preferably placed in the part of the device which is in contact with the wrist. When the user's wrist flexes, said button is pressed and activates the signal. The flexion movement of the user's wrist increases the pressure of the device itself onto the wrist skin, triggering the activation of the button. With said power management system, two problems are prevented: high power consumption and accidental gestures that the user might otherwise perform involuntarily which could cause wrong commands.

The foregoing description of the controller has been presented for the purposes of illustration and description. It is not intended to be exhaustive or to limit the claimed subject matter to the precise form disclosed. Many modifications and variations are possible in light of the above teaching. Further, it should be noted that any or all of the aforementioned alternate embodiments may be used in any combination desired to form additional hybrid embodiments of the controller. It is intended that the scope of the disclosure be limited not by this detailed description, but rather by the claims appended hereto.

Calibration

In general, it is assumed that users of the controller will not place the device (or individual sensor nodes) in exactly the same place relative to specific tendons each time that the user wears the controller. Further every individual has a different anatomy. One aspect of the controller is the capability to rapidly calibrate itself to any individual wearer.

Calibration can be accomplished in various ways. For example, in one embodiment, calibration is accomplished by connecting the controller to a main station such as a computer or a smartphone, with the calibration software program installed. The software program asks the user to make some finger gestures while wearing the controller, and collects the parameters useful for the device to recognize the gestures. Once finished with the calibration, the controller receives the parameters and thus is ready to work.

Note that in training or retraining the classification system, given the limited number of muscles involved in such gestures, in various embodiments, the classification system is trained or calibrated by using only a subset of recognized gestures or motions in order to find matching points from previously built models.

Further, in various embodiments, this calibration is continually or periodically performed as the system observes the user's actions. Note that periodically or continuously performing the calibration serves at least two purposes. First, repeating the calibration process may help to further refine the gesture model, and second, repeating the calibration process will help to adjust for minor positional movements of the controller on the user's body.

In addition, since the controller is worn by the user, calibration data can be collected even when the user is not actively engaged in using the controller for HCI purposes. This additional calibration data collection allows the system to statistically model likely gestures or movements, and given enough time, the system can infer the gestures or movements that the user is performing.

The controller presents a micro-controller and related electronics able to read the sensors signal, filter it and analyze it in order to perform the gesture recognition and classification. The micro-controller receives the parameter for the classification during the calibration. The calibration can be made by the micro-controller itself or by another computer device connected to the micro-controller.

The purpose of the signal processing unit is to classify the input signals. The classification is based on a set of signals given during calibration. The calibration involved in the training of the classifier has three different phases:

First phase called Hard calibration
Second phase called Soft Calibration
Third phase called Continuous Calibration During hard calibration the user is asked to repeat 4 times each gesture. This process is long, takes from 30 to 60 seconds and is very accurate. During soft calibration the user is asked to repeat each gesture just once. It uses a hard calibration stored in the memory. It updates the stored hard calibration in order to adjust the parameters. It is faster than the hard calibration, and takes less than 10 seconds to perform. During continuous calibration as the classifier runs and recognizes a gesture, the same gesture is also used to recalibrate the classifier algorithm itself. This continuous calibration permits to take into account minimal shifts of the module from the initial position. Shift after shift the module can change the position on the wrist when used with a watch.

This calibration avoids asking the user to repeat a soft/hard calibration. This calibration is completely automated and does not involve the user.

In an alternative calibration the user is asked to move the finger in front of a camera that recognizes the movement of the finger tips and then auto calibrates the algorithm based on the finger movements. This method releases the user from following the usual calibration process.

The usual calibration process requires the user to follow a set of instruction on how to perform the gesture that sometimes might be mis-interpreted by the user. The algorithm is hence divided into two main parts: the calibration and the execution. The calibration starts if the "Calibration needed" block receives a value that is lower than a pre-defined threshold. The first time this algorithm runs the result is always positive because the received value "quality of the classification" is zero. Therefore the Event recognition of the calibration side is active and it analyses the input signal waiting to receive a signal that overcomes a certain threshold that triggers the recognition. The input signal is stored inside this block in a FIFO memory. When the event recognition block is triggered, it moves the FIFO memory to the output. It also counts how many times the event is triggered. The FIFO contains a section of the input signal flow, called windowed signal. This windowed signal is stored in the memory in a slot decided by the count value.

When the count value reaches a certain predefined value "end calibration", the Feature extraction block is triggered. The feature extraction block goes to the memory and analyses all the recorded signals and returns a set of template values that are saved directly in memory. These values gather the significant information extracted from the stored signals. This information are then used to train the classifier.

The Classifier training block then returns an index that represents the quality of that calibration. If this index is above a predefined threshold, the execution phase can start. The first step of the execution phase is the event recognition block, identical block to the one in the calibration phase except for the lack of the counter. The event recognition receives and stores a signal in a FIFO memory. When the signal overcomes a predefined threshold, the module is triggered and it returns the content of the FIFO memory. This set of data goes to the feature extraction module, which purpose is to extract the most characteristic features of the signal and avoid the useless information. This part of useful information is finally sent to the trained classifier that is capable of recognizing which class the input signal belongs to. The classes are defined during the classification training. The final result of the classification is the name of the class. It also returns the index of the quality of the classification.

Gesture Recognition

In various embodiments, the user is provided with mechanisms for performing user-defined gestures or sequences of gestures, and then assigning particular actions to those gestures, either from a pre-defined list of actions, or from user defined actions or macros. In this case, the training described above is the same, with the difference simply being the particular command or macro that is being mapped to the predefined or user-defined gesture.

In various embodiments, an important finger gesture such as the action of tapping a finger against the thumb will be provided by protocol. Such gesture is recognized by the sensor array. It detects that the gesture has been performed, and the position of the tendon involved in the action, in order to identify the finger movement. These pieces of information are given by a trained classifier after a brief signal filtering. The classifier is trained during the calibration.

In order to apply SVM algorithm for gesture recognition, some elements have to be set:
1. features
2. dimension of the dataset
3. stopping condition Different features have been analyzed related to different approaches: differences, time domain features. Better results has been obtained through differences i.e. difference between signals after alignment using a convolution approach. Each feature represents the difference between a signal and a template related to the same microphone. So the minimum number of features is 4 equal to the number of sensors. A binary classification makes it necessary to define two different templates: one for each target. In such a way, the number of features is increased to 8.

Concerning the dimension of the dataset, minimum dimension which do not modify the classification quality is 4 repetitions for each class, so that features matrix has 8 rows and 8 columns. From column 1 to 4 differences are calculated with respect to a template of the first gesture. From column 5 to 8 features are calculated as differences from second gesture as template. From row 1 to 4 signals are related to the first gesture, while from row 5 to 8 are related to the second gesture. So, a feature matrix with 4 sub-matrixes is obtained. In fact, differences performed within the same gesture are lower when compared to difference between different gestures. Such results are obtained in an analysis with two gestures in comparison with the results of the algorithm based on differences implemented on Arduino.

In terms of stopping condition, it is defined through the tolerance of each SVM which is an initialization parameter. Once the training has been performed, if the same training examples are given as inputs, it could be verified that they do not give outputs symmetrically distributed around zero. It happens most frequently with a small dataset rather than with more examples. So the sign of the output is not evaluated around zero. A new threshold is calculated as the mean value between outputs from a single SVM when it receives as input the training set.

Signal Processing

Some analyses can be performed on the raw sensor signals to determine gesture-recognition system. These analyses are generally computationally simple, and are thus suited to being performed on the microprocessors that are built in to each wireless sensor node or into an integrated device such as the aforementioned wristband. However, as discussed above, such processing of raw signals can also be on a downstream receiver or processor during an initial high-power calibration phase. Examples of raw-signal analyses that can provide indications of signal relevance include measures of RMS amplitude of the finger-generated signals and measured power bands.

Signals within a known range of amplitude are most likely to be informative. In this case, a very simple logic test to determine whether a measured signal is within a simple range can be included in the individual sensor nodes, such as, for example, by adding a simple logic gate to the analog to digital converter or to the digital signal processing module. Similarly, an analysis of individual frequency bands of measured signals can also be performed using very simple computational capabilities. For example, in the case that a particular signal where one or more individual frequency bands falls outside a "reasonable" or expected range in known frequency bands are unlikely to be informative. Gesture analysis has underline that minimum sample frequency for the signal is about 200 Hz in the time domain while it is about 800 Hz for the derived signal. Both signals bring to equal results in terms of accuracy in gesture recognition. The only difference is represented by the buffer size. In fact, in the first case, at least 150 samples are needed while the derived signal requires 100 samples. The main benefit in using derived signal is related to use of few samples. As a consequence, only gestures with a fast variation in the magnitude related to each sensor can be recognized.

Signal Examples

Figure 37:
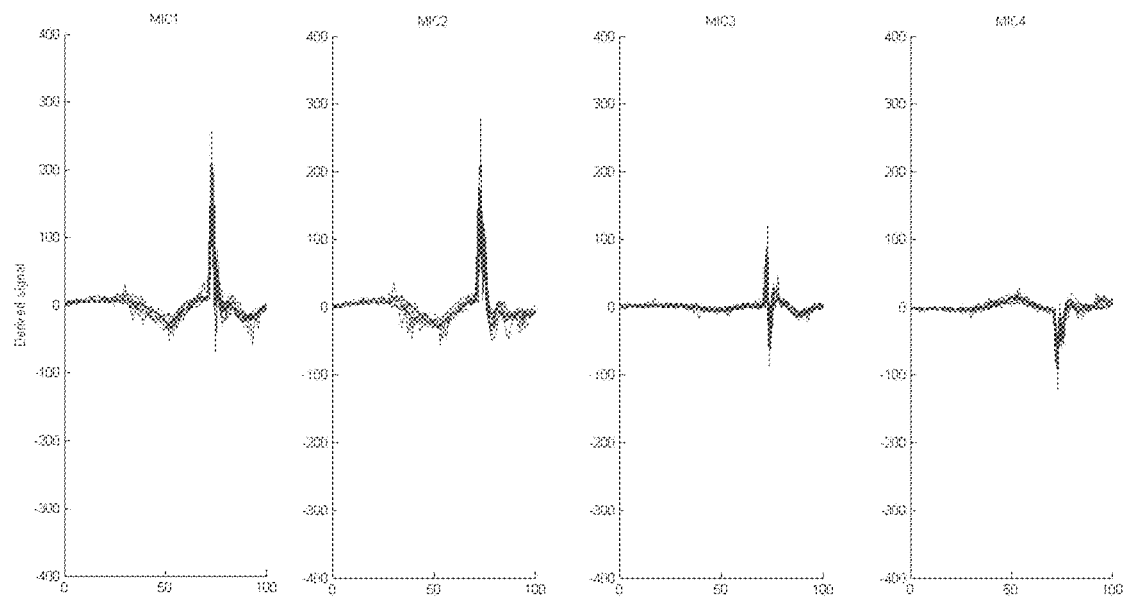
FIG. 37 illustrates a graph of the signals for tapping the index finger for each of the four sensors.
Figure 38:
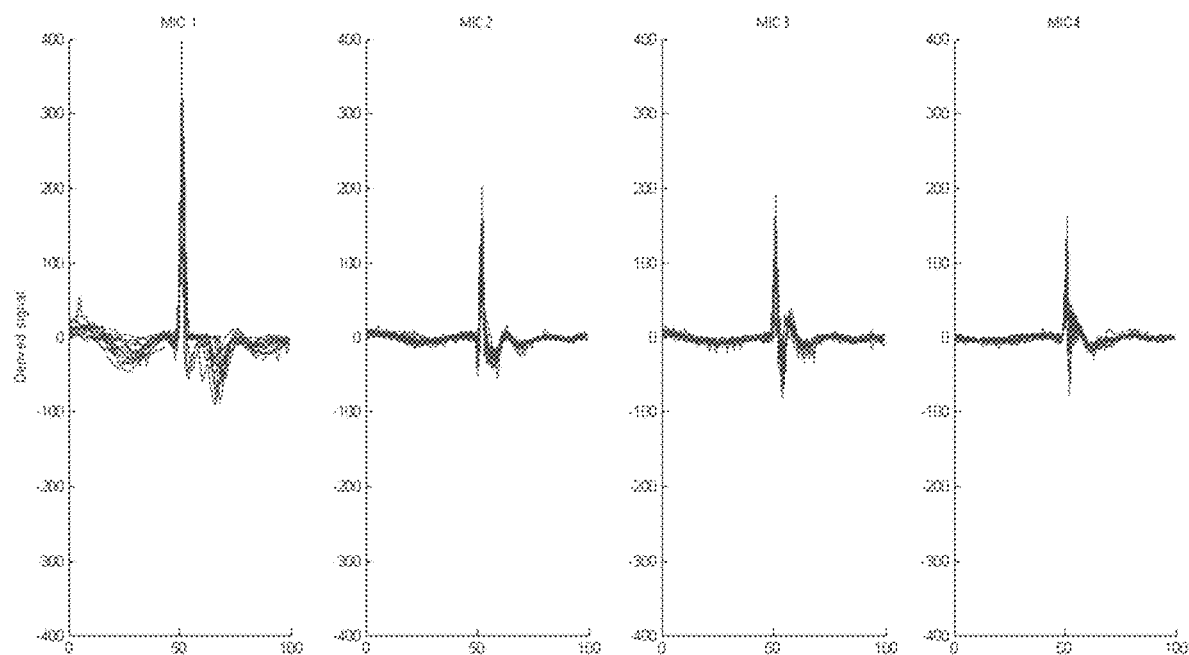
FIG. 38 illustrates a graph of the signals for tapping the ring finger for each of the four sensors.
Figure 39:
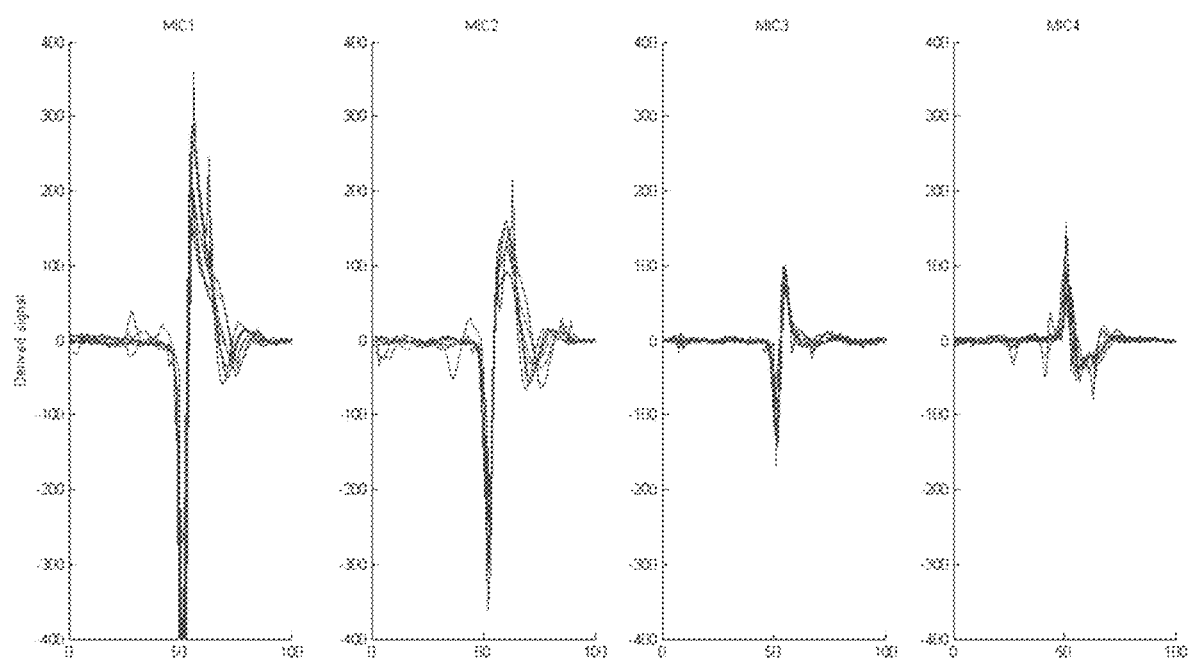
FIG. 39 illustrates a graph of the signals for flicking the index finger for each of the four sensors.

The Following graphs show three gestures which can be recognized with high accuracy through a SVM based on 3 gestures and features based on the differences involving the derived signal. FIG. 37 illustrates a graph of the signals for tapping the index finger for each of the four sensors. FIG. 38 illustrates a graph of the signals for tapping the ring finger for each of the four sensors. FIG. 39 illustrates a graph of the signals for flicking the index finger for each of the four sensors.

Feature matrixes are reported below:

| 1) SVM1: tapping index (1) VS tapping ring finger (2) feat_matrix1_2 = | | | | | | | |
|---|---|---|---|---|---|---|---|
| 0.4141 | 0.2749 | 0.5097 | 0.3342 | 0.8855 | 0.8417 | 1.0000 | 0.6329 |
| 0.3365 | 0.3008 | 0.6740 | 0.2497 | 0.9227 | 0.8402 | 1.0000 | 0.7243 |
| 0.4217 | 0.3470 | 0.6115 | 0.3768 | 1.0000 | 0.9446 | 0.9632 | 1.0000 |
| 0.4096 | 0.3182 | 0.5400 | 0.3752 | 0.9369 | 1.0000 | 1.0000 | 0.9177 |
| 1.0000 | 0.7955 | 0.8323 | 0.7154 | 0.6900 | 0.2657 | 0.2770 | 0.5050 |
| 1.0000 | 0.9049 | 0.9932 | 0.7662 | 0.5258 | 0.2769 | 0.2729 | 0.3981 |
| 0.9527 | 1.0000 | 0.9399 | 0.8243 | 1.0000 | 0.3831 | 0.4399 | 0.5798 |
| 1.0000 | 0.9832 | 1.0000 | 1.0000 | 0.7608 | 0.3542 | 0.4191 | 0.6541 |

| 2) SVM2 tapping index (1) VS flick (3) feat_matrix1_3 = | | | | | | | |
|---|---|---|---|---|---|---|---|
| 0.1180 | 0.1786 | 0.1438 | 0.1975 | 1.0000 | 0.9643 | 0.9263 | 0.8468 |
| 0.0991 | 0.2021 | 0.1966 | 0.1526 | 1.0000 | 1.0000 | 1.0000 | 1.0000 |
| 0.1068 | 0.2005 | 0.1533 | 0.1980 | 1.0000 | 0.9598 | 0.9932 | 0.8216 |
| 0.1078 | 0.1911 | 0.1407 | 0.2049 | 1.0000 | 0.9425 | 0.9329 | 0.9430 |
| 1.0000 | 0.8719 | 1.0000 | 0.8268 | 0.1586 | 0.2474 | 0.2176 | 0.3160 |
| 1.0000 | 1.0000 | 0.8214 | 1.0000 | 0.3333 | 0.4002 | 0.3821 | 0.6115 |
| 1.0000 | 0.9389 | 0.9411 | 0.7452 | 0.4535 | 0.5030 | 0.5294 | 0.7724 |
| 1.0000 | 0.7426 | 0.9175 | 0.6921 | 0.3121 | 0.4510 | 0.5444 | 0.4226 |

| 3) SVM3 tapping ring finger (2) VS flick (3) feat_matrix2_3 = | | | | | | | |
|---|---|---|---|---|---|---|---|
| 0.2024 | 0.2978 | 0.1122 | 0.4444 | 1.0000 | 0.9744 | 0.9515 | 0.9310 |
| 0.1376 | 0.2769 | 0.0986 | 0.3125 | 1.0000 | 1.0000 | 1.0000 | 1.0000 |
| 0.2169 | 0.3175 | 0.1317 | 0.3772 | 1.0000 | 0.8644 | 0.8960 | 0.8750 |
| 0.1686 | 0.2999 | 0.1282 | 0.4348 | 1.0000 | 0.9150 | 0.9529 | 0.9186 |
| 1.0000 | 0.9186 | 1.0000 | 0.8523 | 0.1350 | 0.3248 | 0.2516 | 0.2532 |
| 1.0000 | 0.9637 | 0.7673 | 1.0000 | 0.2838 | 0.5257 | 0.4421 | 0.4905 |
| 1.0000 | 1.0000 | 0.8948 | 0.9539 | 0.3780 | 0.6468 | 0.5995 | 0.6065 |
| 1.0000 | 0.7280 | 0.9629 | 0.7493 | 0.2654 | 0.5918 | 0.6290 | 0.3385 |

As already described, it is possible to distinguish four sub-matrices in terms of magnitude of difference. Values in the matrix have been normalized two times. First each row and then each column i.e. each features (as required by SVM). In summary, the training phase of each SVM requires two templates related to two different gestures for every sensor and four repetitions of each gesture for every microphone.

Results for 10 Subjects

Concerning 3 gestures recognition, 10 (5 F, 5M) different subjects have been analyzed on 15 repetitions of each gesture for the validation process. Following table shows the results and some observations:

| | Errors | accuracy | Note |
|---|---|---|---|
| S1 (F) | 0 | 100% | |
| S2 (M) | 0 | 100% | |
| S3 (M) | 3 | 93.3% | Lower threshold |
| S4 (M) | 2 | 95.5% | Very low threshold |
| S5 (M) | 1 | 97.7% | |
| S6 (F) | 0 | 100% | |
| S7 (F) | 0 | 100% | |
| S8 (F) | 0 | 100% | Lower threshold |
| S9 (M) | 0 | 100% | |
| S10 (F) | 0 | 100% | Lower threshold |

Support Member

Figure 40A:
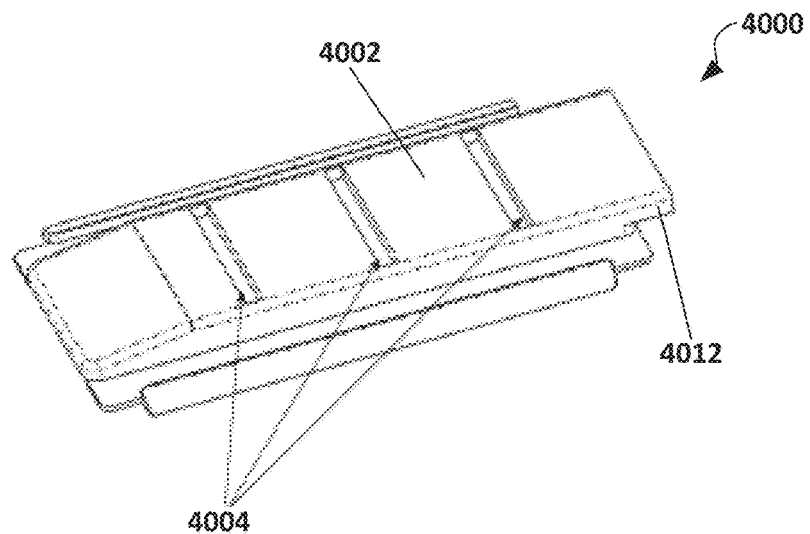
FIGS. 40a, 40b, 40c and 40d are various views of a support member for the cantilever piezoelectric sensors.

FIG. 40*a* is a perspective view from the top of an embodiment of a silicone support member 4000 for the cantilever piezoelectric sensors. A first surface 4002 of the support member abuts a user's skin when the sensor module is in situ about a user's wrist. Several slits 4004 extend across a width of the upper surface 4002.

Figure 40B:
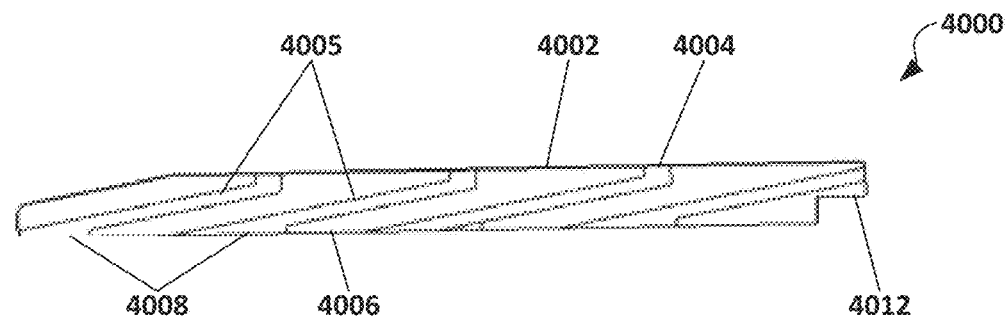

FIG. 40*b* is a lateral cross-sectional view of the support member 4000. The slits 4004 lead to angled slots 4005, which extend generally at an angle through the support member 4000 to a second surface 4006. The second surface 4006 faces away from a user's skin during operation of the sensor, and contacts (or alternatively is provided in close communication with) the PCB. The slots 4005 are aligned at approximately 10 degrees relative to the first and second surfaces and are arranged to overlap vertically. Cut-out sections are provided proximate the end of each of the slots on the second surface 4006, such that a relatively wide opening 4008 of each of the slots is formed on the second surface (at the other end of the slots 4005 to the slits 4004). The slots on the outer edges of the support member 4000 may extend proximate, or into, an edge of the support member.

The cantilever sensors (not shown) are arranged to fit in and be supported within the slots 4005, such that the ends of the cantilever sensors extend proximate to (but not beyond) the first and second surfaces 4002, 4006. This may allow the tips of the sensors to extend close to the skin in the slits 4004, while allowing an other end of the cantilever sensor to contact (or extend close to) the PCB. As mentioned, the support member is arranged not to damp the signal generated by a source of high amplitude low frequency stress. The support member is also arranged to allow pressure to be transmitted through to the piezoelectric sensors. As such, the support member must be soft, so as to allow the piezoelectric sensors to deform under pressure from the tendons, as well as elastic, so as to avoid permanent deformation of the support member. Such a balance of properties may be difficult to achieve.

Figure 40C:
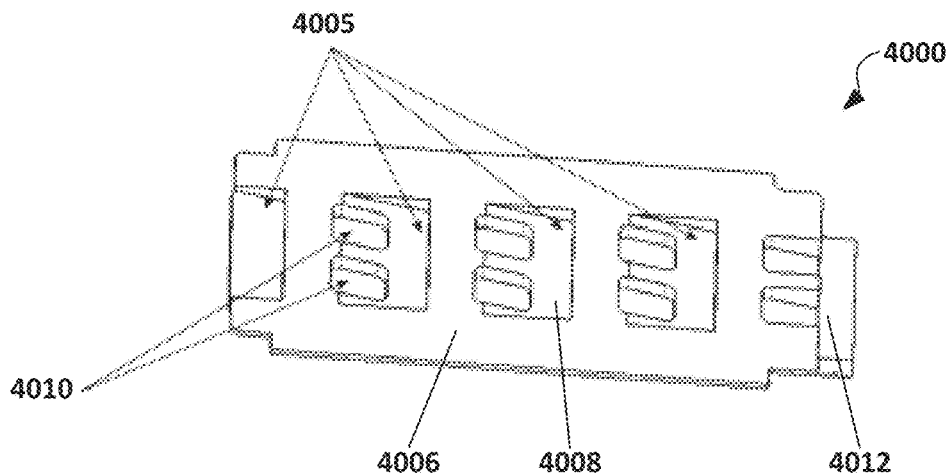

FIG. 40c is a perspective view from the underside of the support member 4000. As shown in the figure, cutouts (or holes) 4010 are provided in the support member, which may assist in providing the required properties. Each cutout 4010 extends across the second surface 4006 and a surface of a slot 4005 (in the opening 4008). The openings 4008 extend only part of the way across a width of the second surface 4006, and are provided generally centrally along the width of the second surface 4006. Two generally rectangular cutouts are provided across each slot (apart from the slot which is provided towards the edge of the second surface). The cutouts are arranged to extend into the slot that is provided vertically above the location of the cutout on the second surface and the opening 4008. As such, two further cutouts are provided on the edge of the support member, proximate a linking member 4012, such that they extend into the slot that is proximate the linking member (and which does not have an opening of another slot provided vertically underneath it). In an alternative embodiment, the cutouts extend from the first surface 4002 into the slots 4005.

The cutouts 4010 may improve the softness of the support member 4000, at the cost of reducing the elasticity of the support member. The area and location of the cutouts 4010 is therefore selected in order to provide the requisite balance between elasticity and softness. In particular, the cutout location is selected so as to provide a varying softness along the length of a cantilever sensor, which may allow for the pressure to vary along the length of a cantilever sensor and/or allow the cantilever sensor to bend under pressure. As such, the cutouts are provided proximate an end of the slot.

Figure 40D:
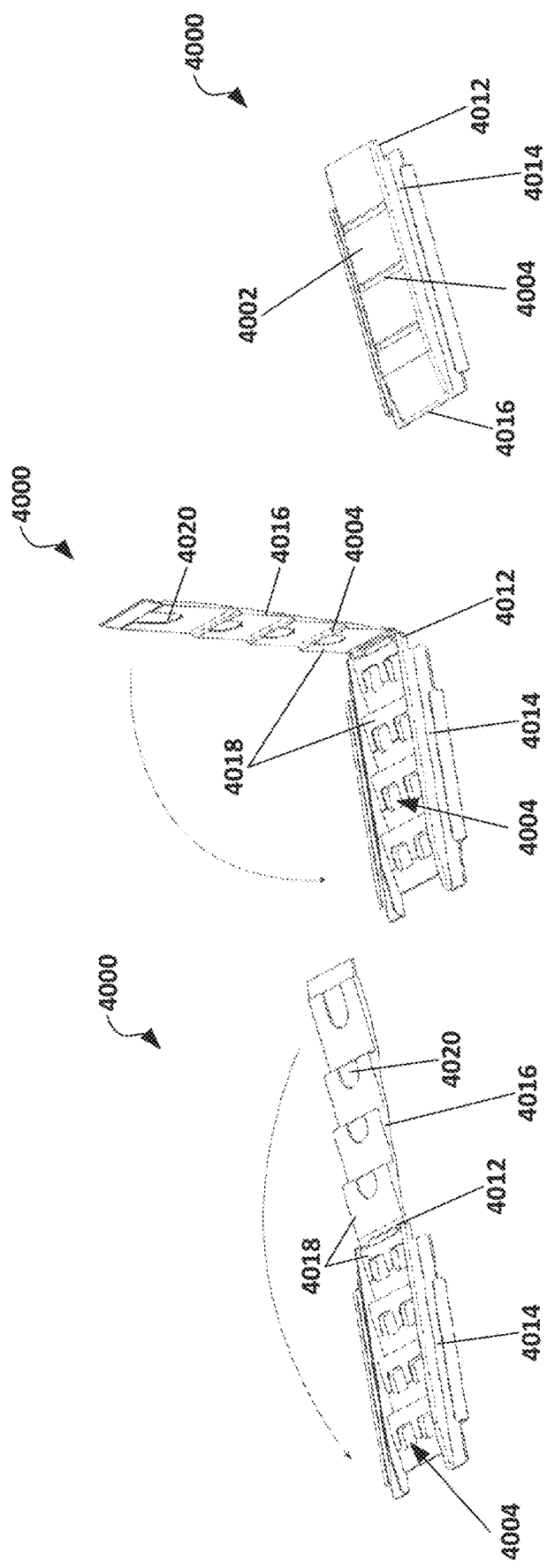

FIG. 40d shows the support member 4000 in different states. In an unfolded state, the support member comprises a lower part 4014 and an upper part 4016, which are connected about the linking member 4012. As indicated in the figure, the upper part is arranged to pivot in relation to the lower part about the linking member, such that when they are pivoted into register with each other (or, alternatively, when they are pivoted into proximity) the assembled support member 4000 (as shown in FIG. 40) is formed. The support member may be held in the assembled state by use of an adhesive or a retaining sleeve, for example.

Each of the upper and lower parts 4014, 4016 have a plurality of angled steps 4018 on surfaces of each part that pivot towards each other, such that when the assembled support member is formed, the angled steps 4018 combine to form the slots 4005. The cutouts 4004 extend throughout the lower part 4014, such that their depth is defined by the thickness of the lower part. The upper part 4016 has recesses 4020 for holding the cantilever sensors in place. The upper part 4016 may correspond to the first layer 2901 described with reference to FIG. 29, while the lower part 4016 may correspond to the second layer described with reference to FIG. 29.

Providing a folding structure to the support member 4000 may allow for improved manufacturability of the support member, in particular the slots 4005, which may be difficult to reliably and repeatably manufacture due to their small size. The folding structure may also allow for the cantilever sensors to be positioned more easily in the slots.

Figure 41:
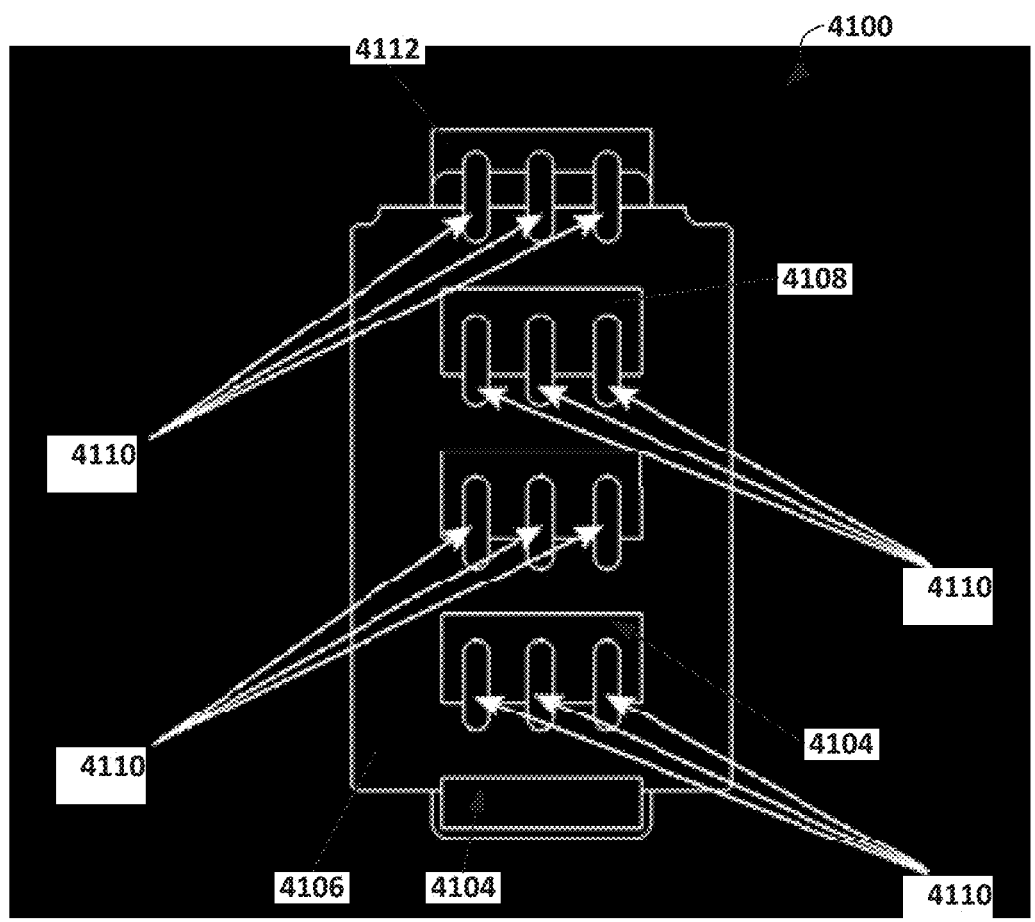
FIG. 41 is an underside view of an alternative support member.
Figure 42:
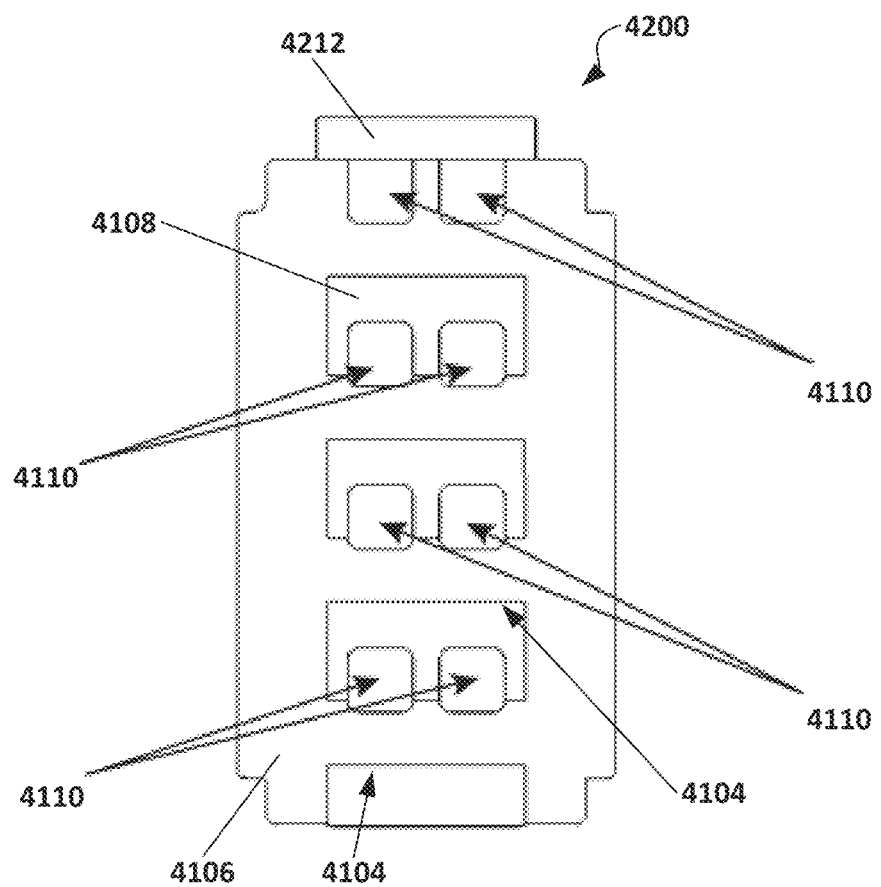
FIG. 42 is an underside view of a further alternative support member.

FIGS. 41 and 42 are underside views of alternative embodiments of a support member 4100, 4200 for the cantilever piezoelectric sensors. In FIGS. 41 and 42, like reference numerals indicate features of the support members 4100, 4200 corresponding to those previously described with reference to the support member 4000 depicted in FIG. 40. The cutouts may be arranged in several different configurations while achieving a substantially similar effect.

Feedback During Calibration

As mentioned, a calibration phase (which may be repeated periodically) typically precedes the use of the device. In this phase, the system may acquire information related to gestures performed by the user, which is used to train the classifier. The classifier is then capable of recognizing gestures which cause the cantilever sensors to produce a signal which is sufficiently similar to the information acquired during calibration. During the calibration phase, users also learn how to perform suitable gestures for recognition based on feedback (as previously described) and instructions, such that if an unsuitable gesture is performed, the user is directed to change their actions, while if a suitable gesture is performed, the user is directed that their actions produce a suitable gesture.

Figure 43:
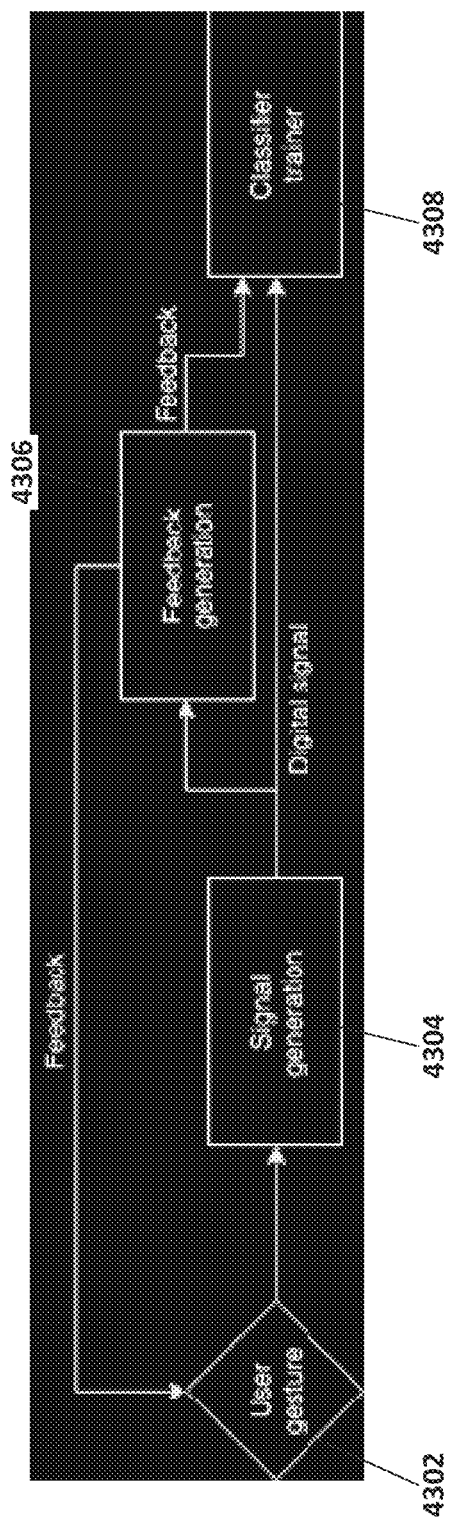
FIG. 43 shows the process of training the classifier and providing feedback to the user.

FIG. 43 shows the process of training the classifier and providing feedback to the user. In step 4302, the user performs a gesture. In step 4304, the cantilever sensors produce a signal based on the gesture. The signal is then compared against pre-stored data (which may be stored in the memory module), and feedback (e.g. 'not similar enough to previous gestures') is generated (step 4306) on the basis of a number of calculated parameters. The parameters, along with the signal itself may be stored into memory and used to train the classifier (step 4308). The feedback is also provided to the user (as described above). The user may then repeat an adjusted version of the gesture according to the feedback, which, if executed according to the feedback, may be more detectable. Training the classifier and providing feedback to the user at the same time may improve the user experience by improving the speed of the calibration phase.

In general, gestures suitable for use with the system are repeatable, short, and produce a signal that is reliably detectable. The system is arranged to evaluate gestures during the calibration phase by comparing a gesture against pre-stored data based on a number of parameters, where feedback relating to each of the parameters may be provided to a user accordingly. Some examples of the parameters are described below.

Repeatability

The system is arranged to calculate the similarity of two of the same gesture. In order to calculate the repeatability of any new gesture introduced during the calibration phase, the following process is performed:
1. A first and a second data set are generated based on a first and a second gesture.
2. The maximum covariance of the datasets is calculated such that the data sets are aligned.
3. The differences between the datasets are calculated.
4. The datasets are normalized, and the difference between the datasets is calculated.
5. The variance and the correlation of the difference of the normalized datasets are calculated.
6. A single index of repeatability is calculated based on the variance and the correlation.

The user is directed to maximize the repeatability of a particular gesture during the calibration phase.

Similarity

The system is arranged to calculate the similarity between two different gestures, which is principally useful where new gestures are introduced by the user. The similarity between gestures should in general be low, so that different gestures can be distinguished from one another. When a new gesture is introduced by the user, the following process is performed:
1. A first data set is produced based on a new gesture, and a second data set based on an existing (different) gesture is recalled form memory.
2. The maximum covariance of the datasets is calculated such that the data sets are aligned.
3. The differences between the datasets are calculated.
4. The datasets are normalized, and the difference between the datasets is calculated.
5. The variance and the correlation of the difference of the normalized datasets are calculated.
6. A single index of similarity is calculated based on the variance and the correlation.
7. The process is repeated so that an index of similarity is calculated between the new gesture and all existing gestures in memory.
8. If the minimum index of similarity is below a predetermined threshold, then the new gesture may be sufficiently different from existing gestures such that it can be reliably recognized, so the new gesture may be approved.

The user is directed to minimize the similarity between gestures during the calibration phase. It will be appreciated that the above process can be adapted so as to calculate the similarity between existing gestures, or between a performed gesture and an existing saved gesture (so as to allow the performed gesture to be classified as an existing gesture).

Magnitude

The system is arranged to calculate the strength of a gesture using the following process:
1. The peak-to-peak value of a signal relating to a particular gesture is calculated.
2. The sum of the absolute value of the individual data points in a signal relating to a particular gesture is calculated.
3. A magnitude index is calculated based on the peak-to-peak value of the signal and the sum of the absolute values.
4. The magnitude index may be compared against a pre-determined threshold. If the index is above this threshold, this may indicate that the signal is strong enough so as to be reliably detected, and so may be approved.

The user is directed to perform the gesture so as to not produce a signal of a reliably detectable magnitude.

Length

The system is arranged to calculate the time taken to perform a particular gesture using the following process:
1. When a new data point is received in a signal, the absolute value between the data point and a mean value (or moving average) of previous data points is calculated.
2. The absolute value is compared against a predetermined threshold, and, if the threshold is exceeded, an indicator is generated.
3. The above steps are repeated for subsequent data points, and if a sequence of indicators is detected, where the indicators occur within a predetermined time period (on a millisecond scale), this may be indicative of a gesture occurring.
4. The number of repetitions of the above steps may be counted by a counter until no further indicator is generated within a predetermined time period, which may indicate that the gesture has ended.
5. The counter may then provide an index indicative of the gesture length.

The calculation of gesture length may be principally useful in determining when gestures take place. The user may also be directed to speed up the performance of a gesture and/or amend the gesture so as to reduce the number of movements, both of which may improve the reliability of detecting the gesture.

Pace

The system is arranged to detect the pace at which the user performs gestures is performed using the following process:
1. When a new gesture is detected, a counter starts counting how much time occurs between the gesture and a subsequent gesture.
2. If the counter is smaller than a predetermined threshold, a negative feedback is sent to the user.

The user may be directed to increase the time taken between subsequent gestures, which may improve the detectability of each gesture.

For reliable sensing, the sensor module has to be in the correct position and correct tightness relative to the wrist. The system may therefore be capable of providing feedback to the user relating to the position and tightness of the user during the calibration phase as well as during normal operation, for example if the sensor module shifts during operation. This may assist in avoiding the need for frequent complete recalibrations of the system.

Position

The system is arranged to detect shifts in the position of the sensor module from the original position using the following process:
1. Similarity indices between a signal generated in response to the performed gesture are calculated (as previously described) in relation to all existing gestures in memory.
2. If a similarity index exceeds a predetermined threshold, indicating that the preformed gesture matches an existing data in memory, the magnitude index of the signal (or optionally, the magnitude index in respect of a signal produced by a single cantilever sensor alone) is generated.
3. If the magnitude index is below a predetermined magnitude (but a gesture is still recognized), this may indicate that the sensor module has slipped relative to its initial position.

4. The relative magnitude indices of the cantilever sensors and the relative positions of the tips of the cantilever sensors may be compared in order to give a direction of the shift.

If a shift in position is detected, the user is directed via feedback to reposition the sensor module.

Tightness

The system is arranged to detect whether the tightness of the sensor module about the wrist changes. The sensor module must be provided tightly enough such that the cantilever sensors are proximate the skin, but not so tightly that significant pressure is exerted on the cantilever sensors in a neutral position, which may reduce the sensibility of the cantilever sensors. During a calibration period or during normal operation, the user may be requested via feedback to perform one or more predetermined gestures, such as a tapping gesture and a flicking gesture. Reference data relating to the magnitude indices of these gestures when the sensor module is worn at the preferred tightness about the wrist may be saved into memory. The magnitude indices of the predetermined gestures may be calculated as described above, and, if these fall outside a range determined with reference to the reference data, this may indicate that the device is too tight or too loose. The user may then be directed to tighten or loosen the device. The request for the user to perform one or more predetermined gestures may be made in response to a detected decrease in the magnitude index between subsequent gestures, for example.

When suitable gestures are used and the sensor module is maintained at the correct position and tightness, the system may be capable of recognizing gestures with a high degree of accuracy (which, in some cases, may be up to 99% accuracy).

It will be understood that the invention has been described above purely by way of example, and modifications of detail can be made within the scope of the invention.

Each feature disclosed in the description, and (where appropriate) the claims and drawings may be provided independently or in any appropriate combination.

Reference numerals appearing in the claims are by way of illustration only and shall have no limiting effect on the scope of the claims.

What is claimed is:

1. A wrist-worn sensor for measuring wrist tendon forces corresponding to specific finger motions comprising:
   one or more piezoelectric sensors, wherein the one or more piezoelectric sensors emit electric currents generated upon pressure from wrist tendons on the one or more piezoelectric sensors;
   a support member for supporting the one or more piezoelectric sensors within the support member, wherein the support member comprises one or more mounting slots for fitting and supporting the one or more piezoelectric sensors, the one or more slots being arranged to support the one or more piezoelectric sensors at an oblique angle relative to a surface of the support member such that, in use, a tip of each of the one or more piezoelectric sensor is adjacent a wearer's wrist, wherein the support member further comprises one or more cutouts extending into the one or more slots, at a location proximate an end of the one or more slots; and
   a processing module configured for converting the electric currents generated upon the pressure from the wrist tendons into signals and for processing the signals for identification of one or more specific finger motions.

2. The wrist-worn sensor of claim 1, wherein the one or more piezoelectric sensors are cantilever piezoelectric sensors.

3. The wrist-worn sensor of claim 1, wherein the one or more piezoelectric sensors are arranged in a linear array; wherein the piezoelectric sensors are spaced apart at their tips by less than 8 mm.

4. The wrist-worn sensor of claim 1 wherein the one or more piezoelectric sensors comprises a plurality of piezoelectric sensors arranged to overlap partially such that their sensor areas overlap.

5. The wrist-worn sensor of claim 1, wherein the support member is formed from an elastomeric material, wherein the elastomeric material filters out low amplitude high frequency signals.

6. The wrist-worn sensor of claim 1, wherein the angle is between 5 degrees and 45 degrees.

7. The wrist-worn sensor of claim 1, wherein the one or more slots terminate in a series of slits on a surface of the support member, the slits being proximate the wearer's wrist in use such that the tips of the sensors are positioned within said slits.

8. The wrist worn sensor of claim 1, wherein the one or more slots extend through the support member.

9. The wrist-worn sensor of claim 1, wherein each of the one or more slots comprises a recess for supporting a piezoelectric sensor of the one or more piezoelectric sensors.

10. The wrist-worn sensor of claim 1 wherein the support member is formed from an upper portion and a lower portion, wherein the one or more slots are formed when the upper portion is engaged with the lower portion.

11. The wrist-worn sensor of claim 10, wherein the upper and lower portions comprise a plurality of angled steps arranged to form the one or more slots when the upper and lower portions are in register with each other.

12. The wrist-worn sensor of claim 11, wherein the upper portion is pivotably connected to the lower portion.

13. The wrist-worn sensor of claim 1, wherein the one or more piezoelectric sensors are arranged such that, in use, the one or more piezoelectric sensors are proximate to one or more of the wearer's Flexor Carpi Ulnaris Tendon, Flexor Digitorum Profundus Tendon and Flexor Digitorum Superficialis Tendon; wherein the one or more piezoelectric sensors are arranged such that, in use, the one or more piezoelectric sensors substantially capture tension applied to any or all of the wearer's wrist tendons.

14. An apparatus comprising the wrist-worn sensor of claim 1 and a controller module.

15. A computer interface comprising the wrist-worn sensor of claim 1 and a controller module configured to cause one or more computing devices to automatically execute one or more specific commands upon identification of the one or more of the specific finger motions.

16. A method for detecting specific finger movements based on wrist-tendon forces using the wrist-worn sensor of claim 1, the method comprising the steps of:
   emitting the electric currents using the one or more piezoelectric sensors upon the pressure generated from the wrist tendons on the one or more piezoelectric sensors;
   extracting a set of characteristic features from the signals converted from the electric currents by the processing module;
   feeding the set of the characteristic features to a trained classifier; and identifying the one or more specific finger motions associated with specific classes of the trained classifier.

* * * * *

UNITED STATES PATENT AND TRADEMARK OFFICE
CERTIFICATE OF CORRECTION

| | |
|---|---|
| PATENT NO. | : 11,281,301 B2 |
| APPLICATION NO. | : 16/074779 |
| DATED | : March 22, 2022 |
| INVENTOR(S) | : Belfiori |

It is certified that error appears in the above-identified patent and that said Letters Patent is hereby corrected as shown below:

On the Title Page

Insert the following:
-- (30) Foreign Application Priority Data
   Apr. 26, 2016 (EP)............................. 16275066.5 --

Item (63) Related U.S. Application Data, Line 1, "Continuation", should be changed to
-- Continuation-in-Part --

Signed and Sealed this
Fifteenth Day of November, 2022

Katherine Kelly Vidal
*Director of the United States Patent and Trademark Office*